US007321959B2

(12) United States Patent
Honda et al.

(10) Patent No.: US 7,321,959 B2

(45) Date of Patent: Jan. 22, 2008

(54) CONTROL METHOD OF A NON-VOLATILE MEMORY APPARATUS

(75) Inventors: Toshiyuki Honda, Kyotanabe (JP); Masayuki Toyama, Neyagawa (JP); Keisuke Sakai, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 229 days.

(21) Appl. No.: 10/496,622

(22) PCT Filed: Sep. 29, 2003

(86) PCT No.: PCT/JP03/12448

§ 371 (c)(1), (2), (4) Date: May 25, 2004

(87) PCT Pub. No.: WO2004/031966

PCT Pub. Date: Apr. 15, 2004

(65) Prior Publication Data

US 2005/0013154 A1 Jan. 20, 2005

(30) Foreign Application Priority Data

Oct. 2, 2002 (JP) ............................ 2002-290297

(51) Int. Cl.
*G06F 12/00* (2006.01)

(52) U.S. Cl. ............ 711/156; 365/185.09; 365/185.33; 711/203

(58) Field of Classification Search ................ 711/203, 711/156; 365/185.09, 185.33
See application file for complete search history.

(56) References Cited

U.S. PATENT DOCUMENTS 5,694,538 A 12/1997 Okazaki et al.
5,978,273 A * 11/1999 Shigemura ............. 365/185.29
6,058,047 A * 5/2000 Kikuchi ................. 365/185.33
6,076,137 A * 6/2000 Asnaashari ................. 711/103
6,125,435 A * 9/2000 Estakhri et al. ............. 711/201
6,182,188 B1 * 1/2001 Hasbun et al. .............. 711/103
6,230,234 B1 * 5/2001 Estakhri et al. ............. 711/103
6,275,436 B1 8/2001 Tobita et al.
6,311,322 B1 10/2001 Ikeda et al.

(Continued)

FOREIGN PATENT DOCUMENTS

JP 9161491 6/1997

(Continued)

*Primary Examiner*—Brian R. Peugh
*Assistant Examiner*—Ryan Dare
(74) *Attorney, Agent, or Firm*—Akin Gump Strauss Hauer & Feld LLP

(57) ABSTRACT

A control method of a non-volatile memory apparatus, which can execute data writing normally after the next startup even when a process is interrupted because of the occurrences of abnormal conditions such as power shut down during data writing or data erasing is provided. The control method of a non-volatile memory apparatus of the present invention comprises: a first flag writing step of writing a fixed value, which indicates that data is written, on a first flag existing in a redundancy area on a first page of a physical block and indicating whether or not data is written on the first page; and a data writing step of writing data on the physical block, when the data is written on the non-volatile memory consisting of a plurality of physical blocks.

5 Claims, 25 Drawing Sheets

501 : PHYSICAL BLOCK
502 : DATA AREA (512B)
503 : REDUNDANCY AREA (16B)
PAGE 0
PAGE 1
PAGE 2
PAGE 31
511 : THE FIRST FLAG

U.S. PATENT DOCUMENTS 6,421,137 B1 * 7/2002 Endo ........................ 358/1.16
6,421,279 B1 * 7/2002 Tobita et al. .......... 365/189.01
6,622,200 B1 * 9/2003 Hasbun et al. .............. 711/103
6,750,908 B1 * 6/2004 Kubo ...................... 348/231.1
6,831,865 B2 * 12/2004 Chang et al. .......... 365/185.33
6,879,528 B2 * 4/2005 Takeuchi et al. ............ 365/200
6,922,768 B2 * 7/2005 Honda et al. ............... 711/206
2002/0069313 A1 * 6/2002 Douniwa et al. ........... 711/102
2002/0172081 A1 * 11/2002 Mukaida et al. ............ 365/200
2003/0099134 A1 * 5/2003 Lasser et al. .......... 365/185.29
2004/0151031 A1 * 8/2004 Tanaka .................. 365/185.29
2004/0193786 A1 * 9/2004 Inagaki et al. .............. 711/105

FOREIGN PATENT DOCUMENTS

JP 11272569 10/1999
JP 11282765 10/1999
JP 2001-051883 A 2/2001

* cited by examiner

FIG. 2

PRIOR ART

105 : ERASED TABLE

| PHYSICAL ADDRESS | DATA |
|---|---|
| 0 | 0 |
| 1 | 1 |
| 2 | 0 |
| 3 | 0 |
| ⋮ | ⋮ |
| 999 | 1 |

FIG. 3

PRIOR ART

106 : LOGICAL ADDRESS/PHYSICAL ADDRESS CONVERSION TABLE

| LOGICAL ADDRESS | PHYSICAL ADDRESS |
|---|---|
| 0 | 123 |
| 1 | 1000 |
| 2 | 0 |
| 3 | 387 |
| ⋮ | ⋮ |
| 999 | 2 |

F I G. 5
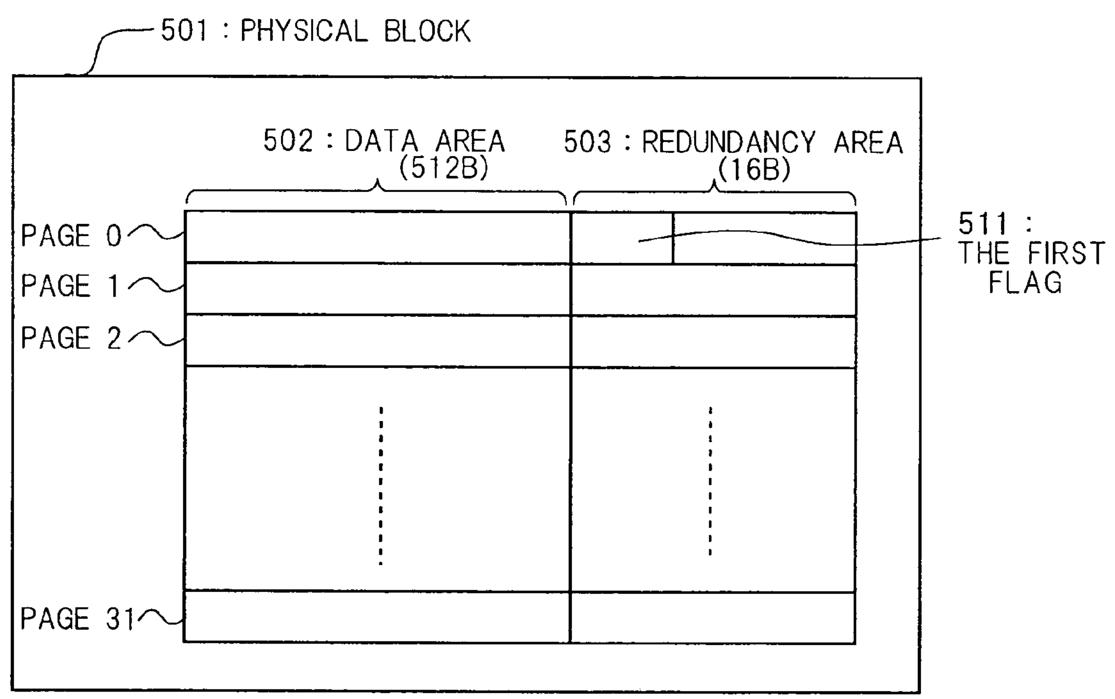

F I G. 6
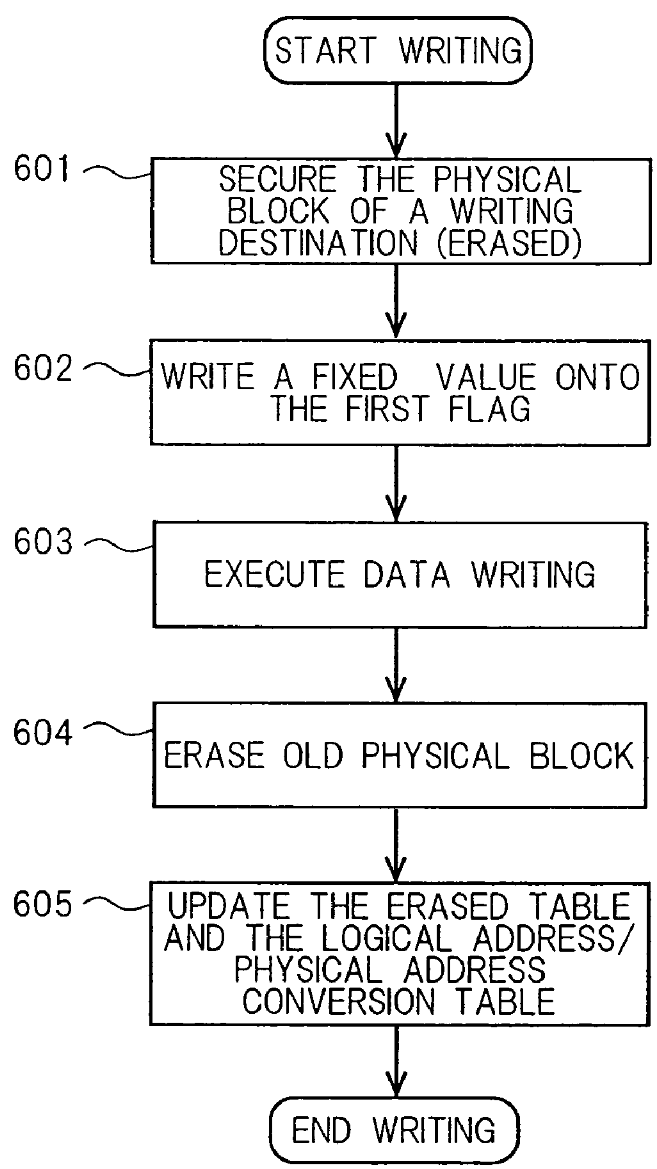

FIG. 7
(a) BEFORE WRITING
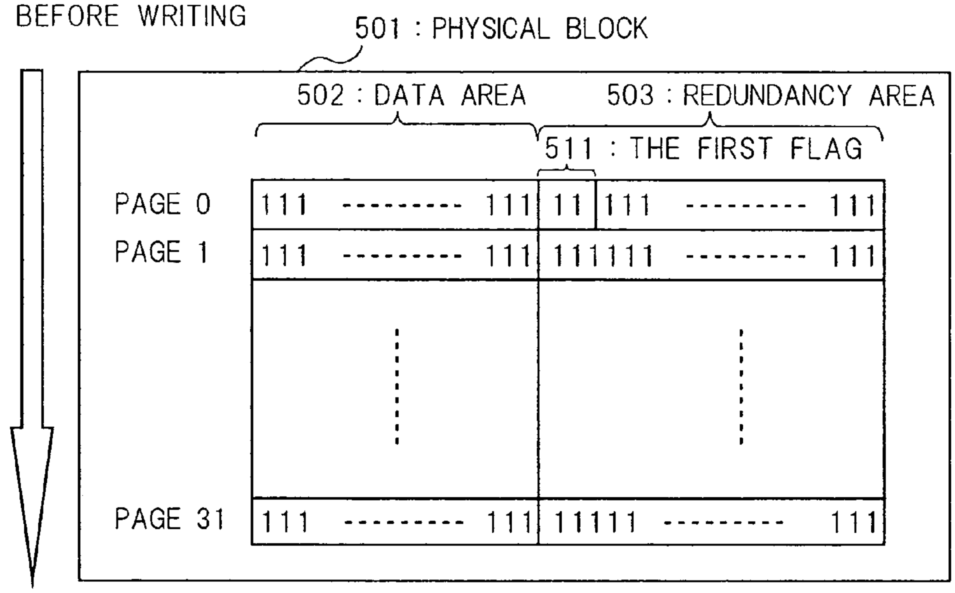
(b) WRITING ONTO THE FIRST FLAG
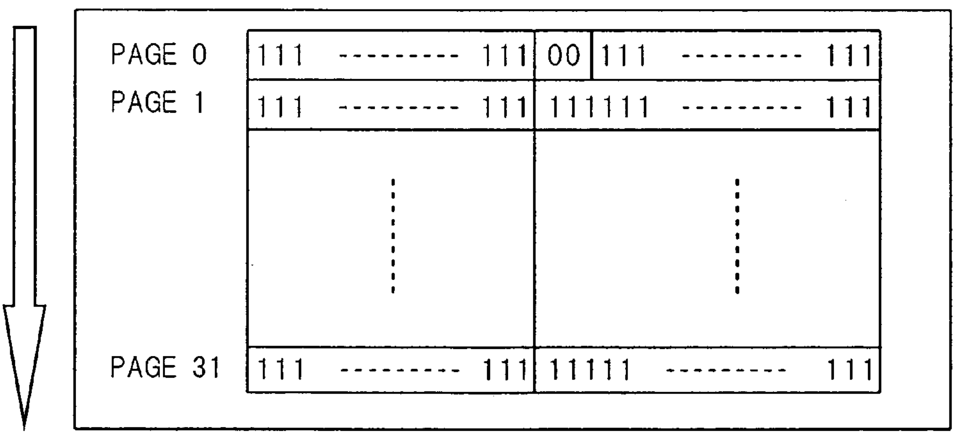
(c) DATA WRITING
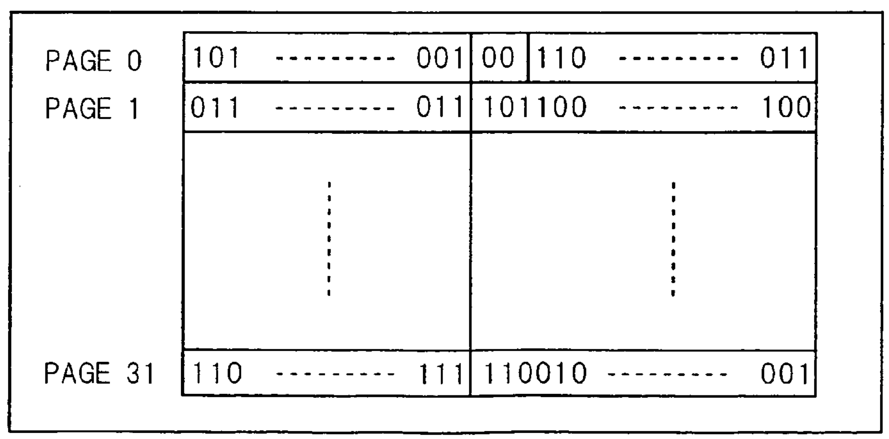

F I G. 8
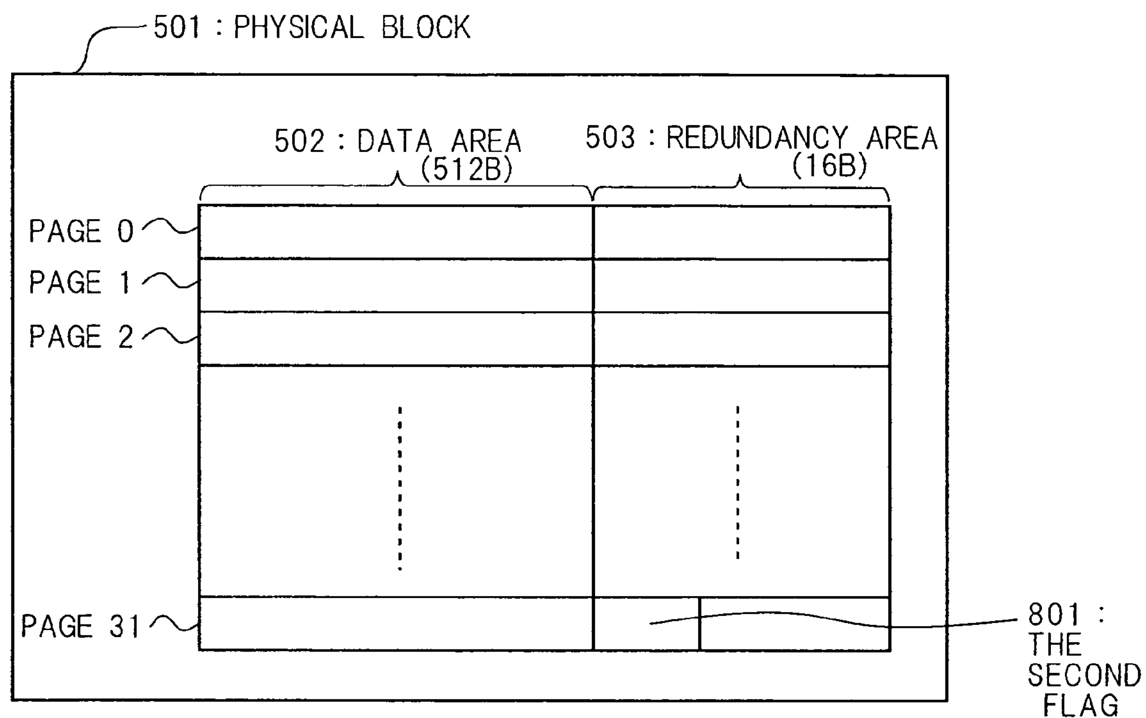

FIG. 10
(a) BEFORE WRITING
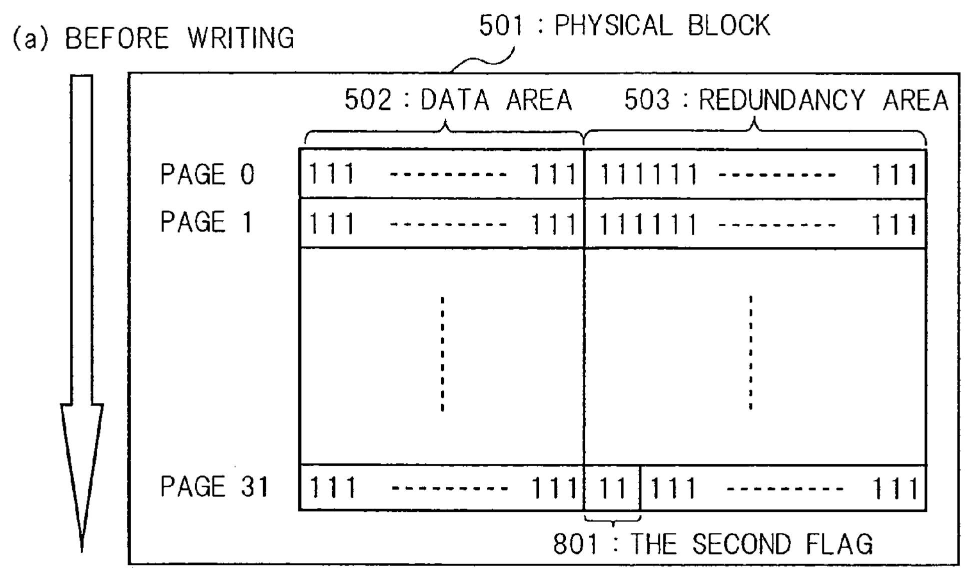
(b) DATA WRITING
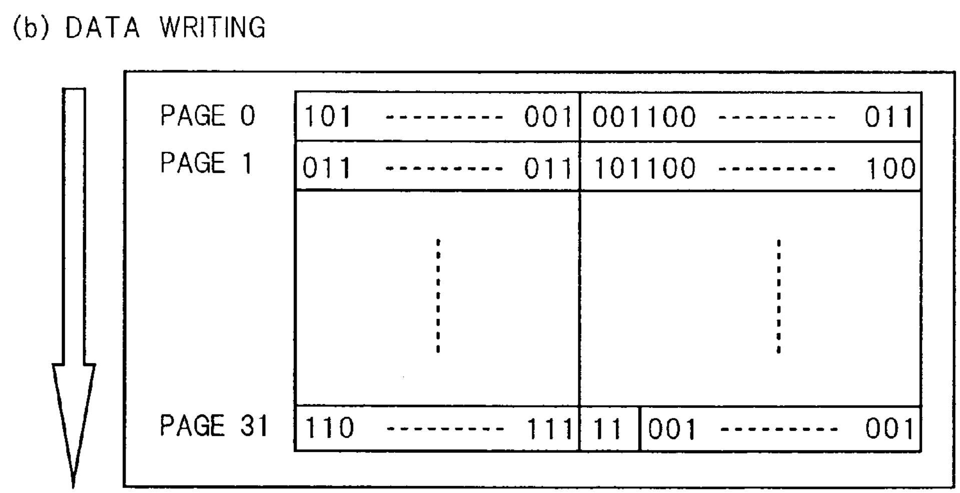
(c) WRITING ONTO THE SECOND FLAG
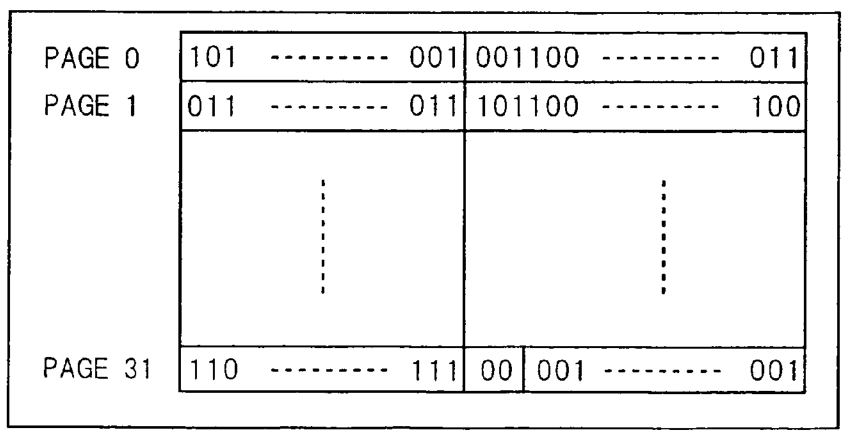

F I G. 1 1
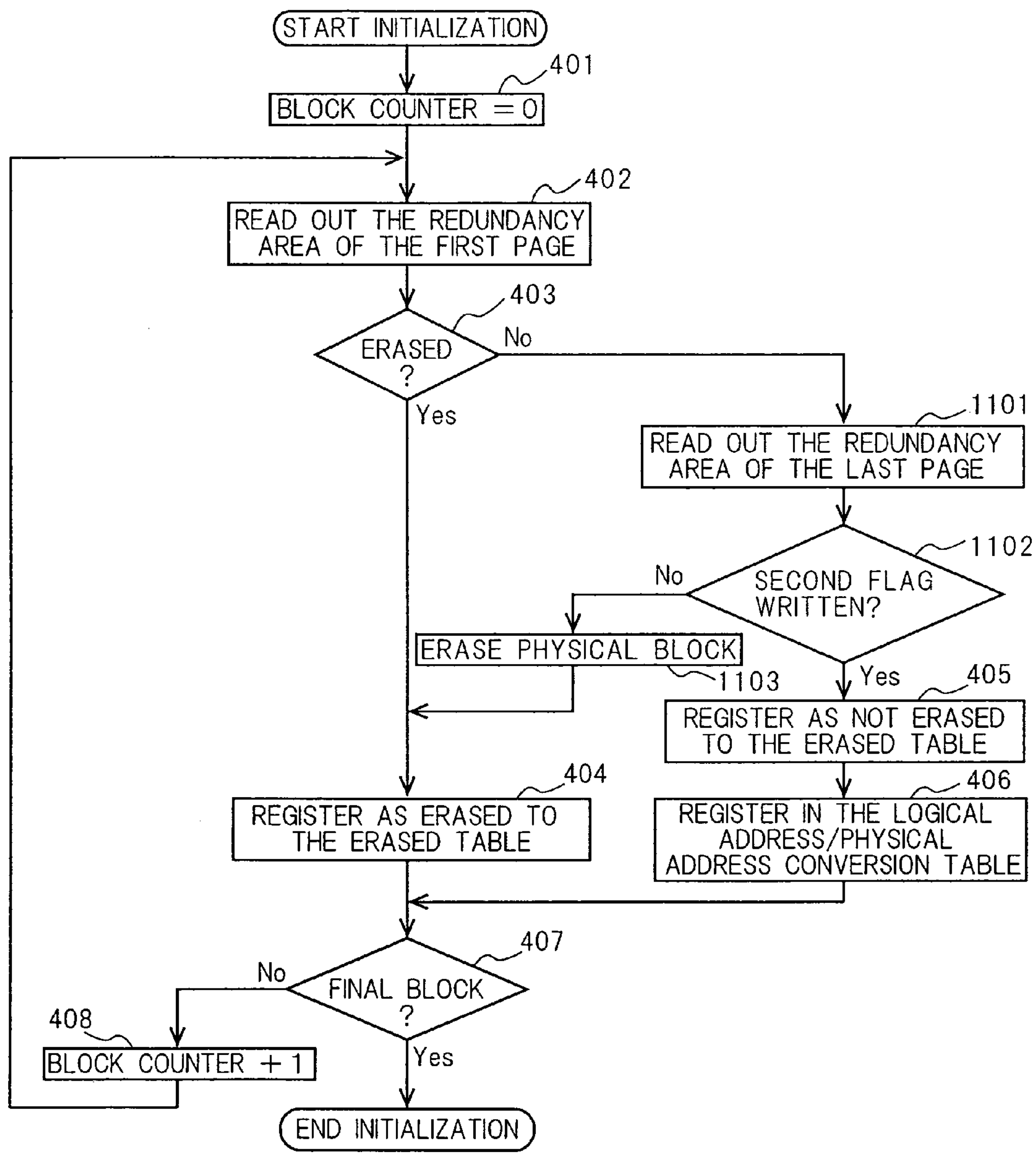

FIG. 17

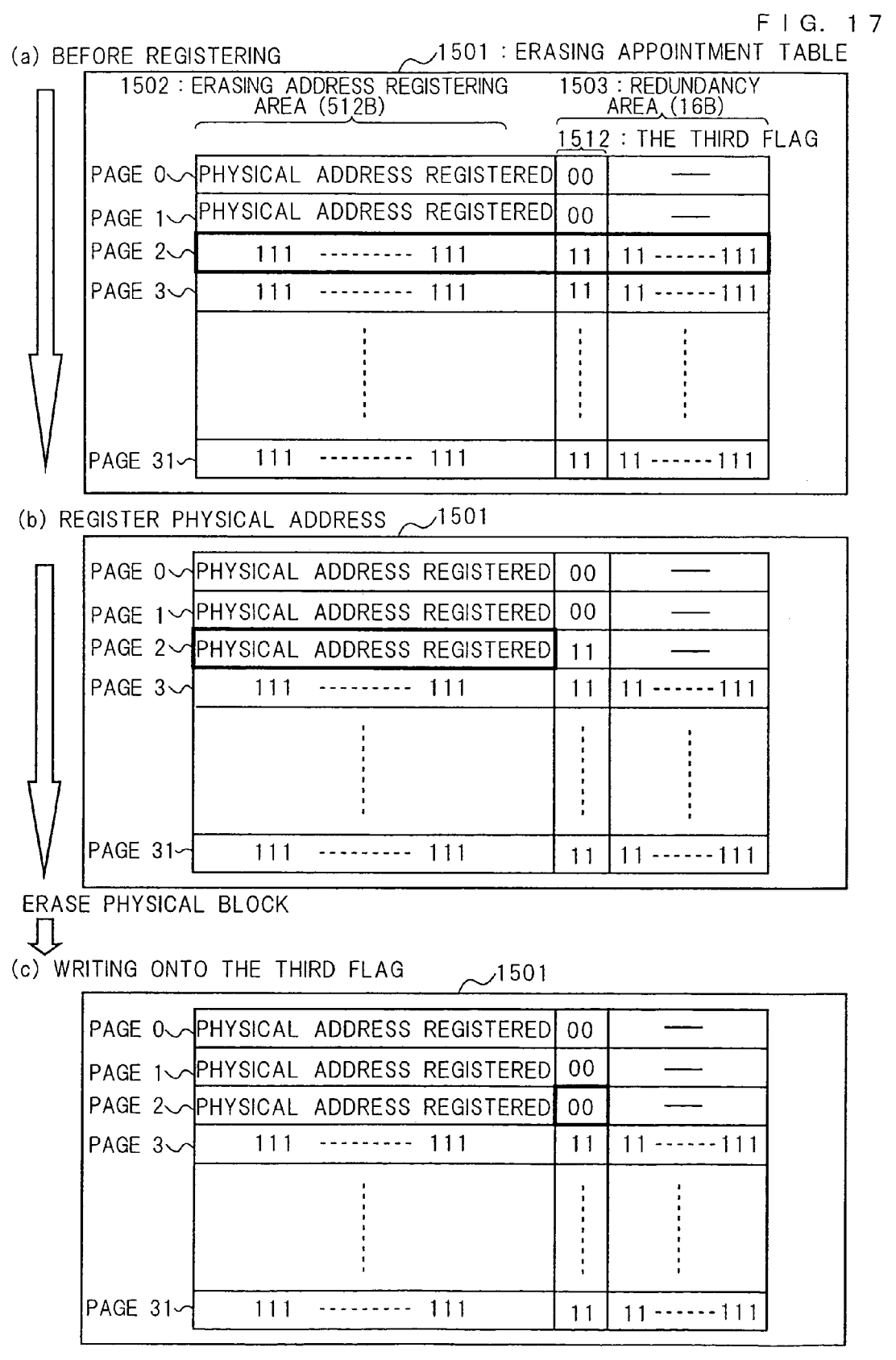

(a) BEFORE REGISTERING

1501 : ERASING APPOINTMENT TABLE

1502 : ERASING ADDRESS REGISTERING AREA (512B) | 1503 : REDUNDANCY AREA (16B) | 1512 : THE THIRD FLAG

| | | 1512 | |
|---|---|---|---|
| PAGE 0 | PHYSICAL ADDRESS REGISTERED | 00 | — |
| PAGE 1 | PHYSICAL ADDRESS REGISTERED | 00 | — |
| PAGE 2 | 111 --------- 111 | 11 | 11 ------111 |
| PAGE 3 | 111 --------- 111 | 11 | 11 ------111 |
| ⋮ | ⋮ | ⋮ | ⋮ |
| PAGE 31 | 111 --------- 111 | 11 | 11 ------111 |

(b) REGISTER PHYSICAL ADDRESS 1501

| | | | |
|---|---|---|---|
| PAGE 0 | PHYSICAL ADDRESS REGISTERED | 00 | — |
| PAGE 1 | PHYSICAL ADDRESS REGISTERED | 00 | — |
| PAGE 2 | PHYSICAL ADDRESS REGISTERED | 11 | — |
| PAGE 3 | 111 --------- 111 | 11 | 11 ------111 |
| ⋮ | ⋮ | ⋮ | ⋮ |
| PAGE 31 | 111 --------- 111 | 11 | 11 ------111 |

ERASE PHYSICAL BLOCK (c) WRITING ONTO THE THIRD FLAG 1501

| | | | |
|---|---|---|---|
| PAGE 0 | PHYSICAL ADDRESS REGISTERED | 00 | — |
| PAGE 1 | PHYSICAL ADDRESS REGISTERED | 00 | — |
| PAGE 2 | PHYSICAL ADDRESS REGISTERED | 00 | — |
| PAGE 3 | 111 --------- 111 | 11 | 11 ------111 |
| ⋮ | ⋮ | ⋮ | ⋮ |
| PAGE 31 | 111 --------- 111 | 11 | 11 ------111 |

F I G. 1 9
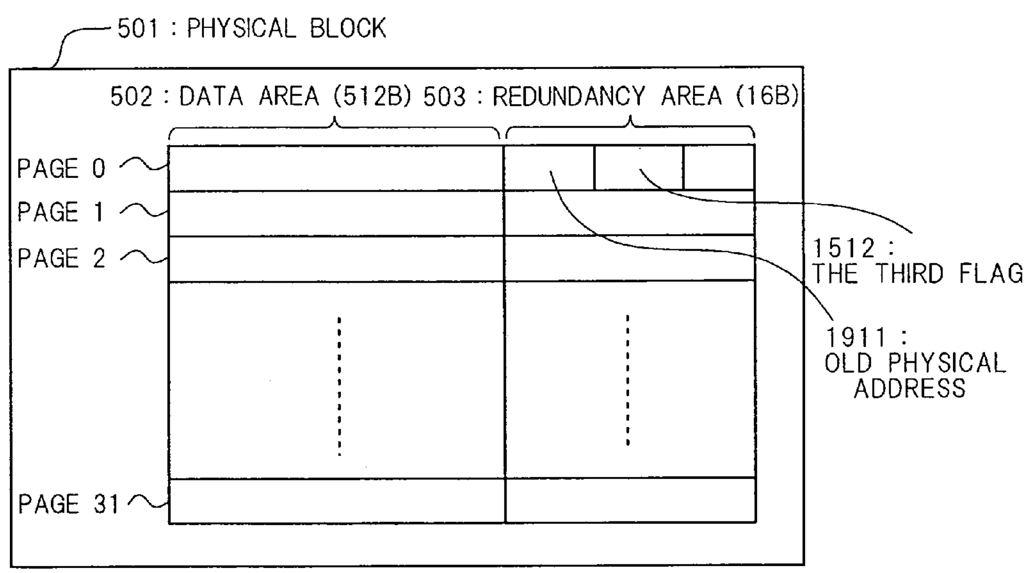

F I G. 2 1
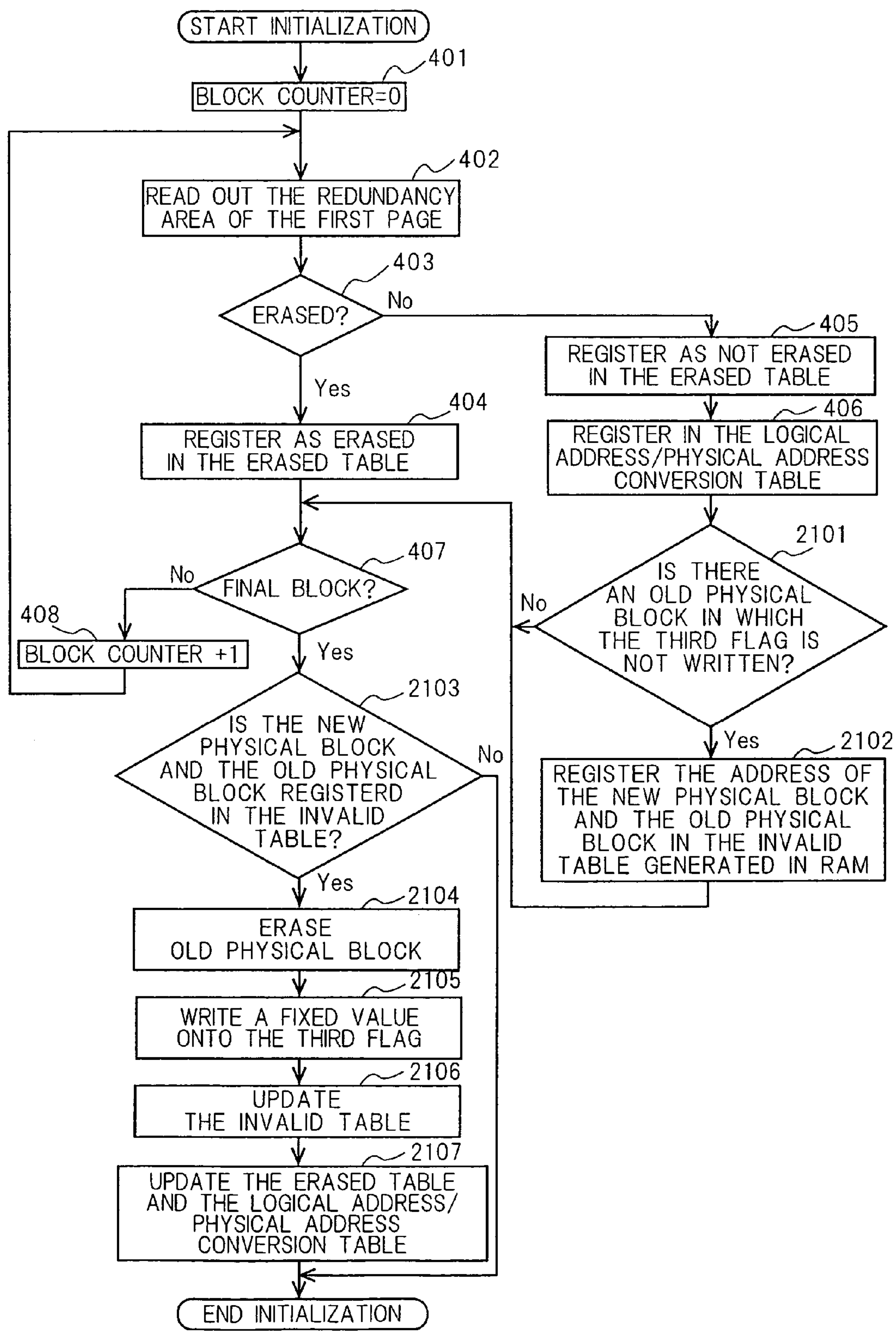

CONTROL METHOD OF A NON-VOLATILE MEMORY APPARATUS

CROSS-REFERENCE TO RELATED APPLICATION

This application is a Section 371 of International Application No. PCT/JP03/12448, filed Sep. 29, 2003, the disclosure of which is incorporated herein by reference.

TECHNICAL FIELD

The present invention relates to a control method of a non-volatile memory apparatus.

BACKGROUND ART

In recent years, a non-volatile memory apparatus having a non-volatile memory such as a flash memory (for example, a memory card) are becoming to be used as a memory apparatus of a portable device that handles music data or visual data, which is rewritable, has a high portability, and does not need a backup protection by a battery or the like.

The conventional control method of a non-volatile memory apparatus will be described with reference to FIG. 1 through FIG. 4, FIG. 24 and FIG. 25. FIG. 1 is a block diagram showing the configuration of the non-volatile memory apparatus. In FIG. 1, a numeral 101 shows a non-volatile memory apparatus and a numeral 102 shows a host. The non-volatile memory apparatus 101 has a non-volatile memory 103, a controller 104, an erased table 105, and a logical address/physical address conversion table 106. The non-volatile memory 103 is a flash memory. The host 102 gives a command to the non-volatile memory apparatus 101 such as data writing and data reading, transmits the data to write on, and receives a readout data sent from the non-volatile memory apparatus 101. The controller 104 of the non-volatile memory apparatus 101 controls the data writing onto the non-volatile memory 103, or the data readout from the non-volatile memory 103, and the like, based on the command from the host 102.

A non-volatile memory 103 consists of a plurality of physical blocks. The configuration of the physical block will be described with reference to FIG. 24. FIG. 24 shows the configuration of a physical block of the non-volatile memory 103 in the conventional art. Physical block 501 consists of 32 pages. The capacity of a single page is 528 bytes, and a page is divided into a data area 502 of 512 bytes and a redundancy area 503 of 16 bytes. The data area 502 is the area to write data transmitted from the host 102. The redundancy area 503 is the area to write the ECC (error correcting code) code for data area 502 and management information such as a logical address corresponding to the physical block 501. A single page is a data writing unit and a data readout unit. When data is written, the data is written in order in a page unit from page 0 to page 31 of the physical block. Operation to write 1 onto the erased memory can be omitted. The physical block 501 is a data erasing unit, and all 32 pages contained in the physical block are erased simultaneously when the data is to be erased. All the bits of the data in the non-volatile memory 103 are 1 when it is in an erased status.

After the power of the non-volatile memory apparatus 101 is turned on, the controller 104 executes an initialization process in which the erased table 105 and the logical address/physical address conversion table 106 are generated on a RAM.

FIG. 2 shows the configuration of the erased table 105. The erased table 105 is a table indicating whether the physical block is erased (unwritten) or not, and a 1-bit data is corresponded to each physical block. In FIG. 2, the left column shows the physical address (an address of a physical block of the non-volatile memory 103 is referred to as "a physical address"), and the right column shows the data wherein 1 indicates "erased" and 0 indicates "not erased". The physical address in the left column is stated for explanatory purpose, and are generally not written onto a RAM. Generally, a physical address is converted to a RAM address by a pre-determined conversion formula, and a bit which indicates whether the physical block is erased (unwritten) or not is written onto the RAM address.

For example, when data including a bit of value 0 is written onto the redundancy area 503 of the first page of the physical block of the physical address 0 in an initialization process (when not all bits of the redundancy area of the first page are 1), it will be judged as written, and 0 will be written as the data of the physical address 0. When a redundancy area 503 of the first page of the physical block of the physical address 1 are all data of 1, it will be judged as erased and 1 will be written as the data of the physical address 1. In this way, the erased table 105 is completed to the final physical address.

FIG. 3 shows the configuration of a logical address/physical address conversion table 106. In the non-volatile memory apparatus 101 using a non-volatile memory 103, the address designated by the host 102 (referred to as "a logical address") and the address located within the non-volatile memory 103 (referred to as "a physical address") are not generally same. When the addresses are made same, application will be burdened by the reason that the physical address in which a defect had occurred within the non-volatile memory cannot be used, that data rewriting takes time, and so forth. And, in a system where writing onto a specific address occurs frequently, an adverse consequence would occur in which the physical address exceeds its guaranteed rewriting number of times (the guaranteed rewriting number of times of a non-volatile memory is generally limited) in a short term and will be short-lived. The controller 104 of the non-volatile memory apparatus 101 converts the logical address designated by the host 102 to a physical address, and writes the logical address corresponding to its physical address onto the redundancy area 503 at the time of data recording of the physical block. Generally, the logical address is written onto the redundancy area 503 of the first page.

After the power of the non-volatile memory apparatus 101 is turned on, the controller 104 reads out the logical addresses written on the redundancy areas 503 of the physical blocks, and generates a logical address/physical address conversion table 106 on a RAM. For example, when data exists in the first page of a physical block of the physical address 0, and 2 is written as the logical address, 0 is written as the physical address corresponding to the logical address 2 in the logical address/physical address conversion table 106. When data exists in the first page of the physical block of the physical address 2, and 999 is written as the logical address, 2 is written as the physical address corresponding to the logical address 999 in the logical address/physical address conversion table 106. When a corresponding data of the logical address does not exist in the non-volatile memory, for example, when there is no physical block having 1 written as the logical address, value 1000 which indicates that data does not exist is written as the physical address corresponding to the logical address 1 in the logical address/physical address conversion table 106.

FIG. 4 is a flowchart of an initialization process of a conventional non-volatile memory apparatus 101. 0 (initial value) is set in the block counter (step 401). The controller 104 reads out the redundancy area 503 of the first page of the physical block which is the target for read out of a non-volatile memory 103 (step 402). The redundancy area 503 is judged whether it is erased or not (step 403). When the redundancy area 503 is data of all 1, it is judged as erased and when data including a bit of value 0 is written, it is judged as written. When the redundancy area 503 is erased, 1 is written onto its physical block column of the erased table 105 for registering the physical block as erased (step 404). When the redundancy area 503 is not erased, 0 (not erased) is written onto its physical block column of the erased table 105 (step 405). When the redundancy area 503 is not erased, the logical address written onto the redundancy area 503 is read out, and a physical address is registered in the place corresponding to its logical address of the logical address/physical address conversion table 106 (step 406). Whether it is a final physical block or not is judged (step 407). When it is not a final physical block, 1 is added to the block counter (step 408), returns to step 402 and the process is repeated. When it is a final physical block, initialization is completed.

Data rewriting method of a non-volatile memory 103 will be described. When the host 102 gives a command of data writing onto the non-volatile memory apparatus 101, the controller 104 writes the data transmitted from the host 102 onto the non-volatile memory 103. FIG. 25 is a flowchart of a data rewriting method of a non-volatile memory apparatus 101 in the conventional art. The controller 104 detects the erased physical block from the erased table 105, and secures it as a physical block of a writing destination (step 601). Data is written onto the secured physical block in a page unit (step 603). A physical block (old physical block) which includes invalid data (data which became unnecessary as a result from writing a new data) is erased (step 604). The old physical block can be erased then and there, or, by temporarily setting the flag indicating whether the data is valid or not to a value indicating invalid on the spot, erasing can be executed at another timing. The erased table 105 and the logical address/physical address conversion table 106 are updated (step 605). More specifically, 0 (written) is written onto a bit corresponding to the physical block in which writing was executed, in the erased table 105. After the old physical block (a physical block which includes invalid data) is erased, 1 (erased) is written onto the bit corresponding to the old physical block. The physical address corresponding to the logical address in the logical address/physical address conversion table 106 is updated to the new physical block, in which writing has been executed, from the old physical block.

When an abnormal condition such as a power shut down occurs during data writing in step 603, there is a possibility that the data of the physical block which was during writing becomes an incorrect data.

In the Official Gazette of Japanese Unexamined Patent Publication 2001-51883, a non-volatile memory apparatus of the conventional art 1 having a non-volatile memory equipped with a self-repairing function which would automatically restore after the next startup to the status before the writing, when a process is ended during writing due to abnormal condition of a power shut down and the like, is described. The non-volatile memory apparatus of the conventional art 1 has a during writing flag, an address buffer and a data buffer at the exterior of a memory. The during writing flag is put into a valid status during data writing, and the during writing flag is put into an invalid status at all other times. When the during writing flag is in a valid status at the startup, the content of the data buffer is written onto the memory area which is indicated by the address buffer. Furthermore, owing to this, the apparatus can be restored, at a startup, to the status before the abnormal writing.

In a non-volatile memory apparatus in the conventional art, when an abnormal condition such as a power shut down occurs during data writing to the first page of the physical block in step 603, there can be a situation in which data is partially written only onto the data area 502, and the redundancy area 503 is erased (unwritten). When initialization is executed under this situation, it would wrongly judge this physical block as erased, since the erased table 105 is generated based on the data of the redundancy area 503 of the first page.

When an abnormal condition such as a power shut down occurs during erasing of the old physical block in step 604, there can be a situation in which the first page of the old physical block is erased, and other pages are not erased. When initialization is executed under this situation, it would wrongly judge this old physical block as erased.

In a case where such physical block which is not erased is wrongly judged as erased, it would result to writing data onto a physical block which is wrongly judged as erased, when data writing occurs thereafter. Since non-volatile memory cannot overwrite data to a written physical data (writing 1 onto a bit of 0 in a page unit is not possible), there was a problem in which data cannot be written correctly and becomes an incorrect data.

There can also be a situation in which, due to interruption of writing or interruption of erasing, the redundancy area of the first page of the physical block is written, and other pages are not written. When initialization is executed under this situation, it would read out the logical address written onto the redundancy area of the first page, and register it in the logical address/physical address conversion table 106. It would wrongly judge the physical block during writing or erasing as a valid written physical block. It is likely that a management data of the non-volatile memory 103 is written onto the redundancy area 503 of the first page of the physical block, and when an incorrect table is generated in the initialization process, there is a possibility that it may become impossible to access the non-volatile memory 103.

In a non-volatile memory apparatus in the conventional art 1, there is a possibility that processing of the non-volatile memory apparatus may become slow, due to necessity to write the data onto a great number of buffer (during writing flag, address buffer (logical address buffer, old physical address buffer, new physical address buffer) and data buffer) every time before data writing.

It is an object of the present invention to provide a control method of a non-volatile memory apparatus which can operate data writing normally after the next startup even when a process is interrupted due to the occurrences of abnormal conditions such as power shut down during data writing or data erasing. Thereby, a control method of a non-volatile memory apparatus which can correctly access a non-volatile memory and has a high data reliability can be provided.

DISCLOSURE OF INVENTION

In order to solve the above-mentioned problem, the present invention has the following configuration.

A control method of a non-volatile memory apparatus in accordance with the present invention from one aspect comprises: a controlling step of controlling data writing and data readout of the above-mentioned non-volatile memory, by using an erased table indicating whether a physical block which is a minimum erasing unit of data of the non-volatile memory is erased or not, and a logical address/physical address conversion table which converts a logical address to a physical address; a first flag writing step of writing a fixed value, which indicates that data is written, on a first flag existing in a redundancy area on a first page of a physical block and indicating whether data is written onto the first page or not, wherein the first page is within a plurality of pages which are included in the above-mentioned physical block, have a data areas and the above-mentioned redundancy areas, and each of which is a minimum data writing unit; and a data writing step of writing data onto the physical block.

In regard to the conventional control method of a non-volatile memory apparatus, for example when data is written onto the physical block consisting of 32 pages, data were written in at 32 times of the writing step which makes a single page a unit. However, when a power is shut down during writing, an incorrect physical block in which data writing is not completed would exist. In order to know for certain whether one physical block is erased or not with consideration to such abrupt power shut down, all the bits in the 32 pages had to be checked, and must check whether all bits are 1 or whether a bit of 0 is included.

Allocating the first flag to the first page, and writing the data of the first page with the first flag at the same time is conceivable. However, when a power is shut down during writing onto the first page, there is a possibility of a situation in which the data is written successfully onto the data area of the first page, and the first flag is not written (a situation in which the value of the bit is still 1 although intended to record 0). Therefore, judging whether one physical block is truly erased or not is difficult even with such a method.

In regard to the present invention, only the first flag of a fixed value (00 in the embodiment) is written singularly at first, and then the general data is written onto 32 pages. Therefore, once the writing starts, the first flag will be a pre-determined fixed value (for example, 00) for certain, even when a power is shut down during writing. When the first flag is not a fixed value (for example, 11), that physical block is erased for certain.

The present invention realizes a control method of a non-volatile memory apparatus which detects for certain whether the physical block is erased or not even when a power is shut down during writing.

The above-mentioned control method of a non-volatile memory apparatus in accordance with the present invention from other aspect further comprises an initialization step of reading out the above-mentioned first flag of all the above-mentioned physical blocks of the above-mentioned non-volatile memory at the startup of the non-volatile memory apparatus, and generating the logical address/physical address conversion table and the erased table based on whether the above-mentioned first flag is written or not.

According to the present invention, an accurate erased table can be generated within a short time even in an initialization process after a power was shut down during writing. Thereby, writing data wrongly to a physical block that is not erased can be prevented.

A control method of a non-volatile memory apparatus in accordance with the present invention from another aspect comprises: a controlling step of controlling data writing and data readout of the above-mentioned non-volatile memory, by using a logical address/physical address conversion table which converts a logical address to a physical address; and a data writing step of writing data onto the physical block; and a second flag writing step of writing a fixed value, which indicates that data is written on the physical block, on a second flag existing in the redundancy area on a pre-determined page of the above-mentioned physical block and indicating whether data is written onto the physical block or not, wherein the pre-determined page is within a plurality of pages which are included in the above-mentioned physical block, have data areas and the above-mentioned redundancy areas, and each of which is a minimum data writing unit.

In regard to the conventional control method of a non-volatile memory apparatus, when data is written onto the physical block consisting of 32 pages for example, the data were written in 32 times of the writing step which makes a single page a unit. However, when a power is shut down during writing, an incorrect physical block would occur in which data writing is not completed. Judging whether one physical block is truly written or not with consideration to such abrupt power shut down, is difficult.

Allocating the second flag to the pre-determined page, more preferably to the 32nd page, and writing the data of the 32nd page together with the second flag at the same time is conceivable. However, when the power is shut down during writing onto the 32nd page, there is a possibility of a situation to occur in which the second flag is written properly, and one of other bits is not written (a situation in which the value of the bit is still 1 although intended to record 0). Therefore, judging whether one physical block is truly written or not is difficult even with such a method.

In regard to the present invention, the general data is written onto the 32nd page, and lastly, only the second flag of a pre-determined fixed value (00 in the embodiment) is written singularly. Therefore, when the second flag is a fixed value (00 for example), the writing of that physical block is ended for certain. When the second flag is not a fixed value (11 for example), it can be judged that a power was shut down during data writing.

The present invention realizes a control method of a non-volatile memory apparatus which detects for certain whether the physical block has correctly ended writing or not even when a power was shut down during writing.

The above-mentioned control method of a non-volatile memory apparatus in accordance with the present invention from still another aspect further comprises an initialization step of reading out the above-mentioned second flags of all the above-mentioned physical blocks of the non-volatile memory at the startup of the above-mentioned non-volatile memory apparatus, and generating the logical address/physical address conversion table based on whether the above-mentioned second flag is written or not.

According to the present invention, an accurate logical address/physical address conversion table can be generated within a short time even in an initialization process after a power was shut down during writing. Thereby, wrongly judging an incorrect physical block in which writing is not completed as a valid physical block can be prevented.

A control method of a non-volatile memory apparatus in accordance with the present invention from still another aspect comprises: a controlling step of controlling data writing and data readout of the above-mentioned non-volatile memory, by using an erased table indicating whether a physical block which is a minimum erasing unit of data of the non-volatile memory is erased or not, and a logical address/physical address conversion table which converts a logical address to a physical address; a first flag writing step of writing a fixed value, which indicates that data is written, on a first flag existing in a redundancy area on a first page and indicating whether data is written onto the first page or not, wherein the first page is within a plurality of pages which are included in the above-mentioned physical block, have data areas and the above-mentioned redundancy areas, and each of which is a minimum data writing unit; and a data writing step of writing data onto the physical block; and a second flag writing step of writing a fixed value, which indicates that data is written on the physical block, on a second flag existing in the redundancy area on a pre-determined page of the above-mentioned physical block and indicating whether data is written onto the physical block or not.

In regard to the present invention, a fixed value (00 in the embodiment) is written singularly onto the first flag at first, and then the general data is written onto 32 pages, and finally, only the second flag of a fixed value (00 in the embodiment) is written singularly. Therefore, when the first flag is not a fixed value (11 for example), the physical block can be judged as erased. When the first flag is a fixed value (00 for example) and the second flag is not a fixed value (11 for example), it can be judged that a power was shut down during writing and that the writing is not completed. When the first flag and the second flag are both a fixed value (00 for example), the writing of the physical block can be judged as completed for certain.

The present invention realizes a control method of a non-volatile memory apparatus which detects for certain whether the physical block is erased or not, and whether the physical block has correctly ended writing or not, even when a power is shut down during writing.

The above-mentioned control method of a non-volatile memory apparatus in accordance with the present invention from still another aspect further comprises an initialization step of reading out the above-mentioned first flags and the above-mentioned second flags of all the above-mentioned physical blocks of the non-volatile memory at the startup of the above-mentioned non-volatile memory apparatus, and generating the logical address/physical address conversion table and the erased table based on whether the above-mentioned first flag and the above-mentioned second flag is written or not.

According to the present invention, an accurate erased table and an accurate logical address/physical address conversion table can be generated within a short time even in an initialization process after a power was shut down during writing. Thereby, wrongly writing data to a physical block that is not erased can be prevented. Wrongly judging an incorrect physical block which has not completed writing as a valid physical block can be prevented.

The above-mentioned control method of a non-volatile memory apparatus in accordance with the present invention from still another aspect comprises: a writing step of writing an ECC code and/or a CRC code of data of a last page, or these codes as well as complementary data of the ECC code and/or the CRC code onto the redundancy area of the last page when writing data on the physical block; and an initialization step of reading out data and the ECC codes and/or the CRC codes of the data, or these data and codes as well as complementary data of the ECC code and/or the CRC code, from the last pages of all of the above-mentioned physical blocks of the above-mentioned non-volatile memory, executing an error detection, and generating the logical address/physical address conversion table based on presence or absence of an error at the startup of the above-mentioned non-volatile memory apparatus.

According to the present invention, an accurate logical address/physical address conversion table can be generated within a short time even in an initialization process after a power was shut down during writing. Thereby, wrongly judging an incorrect physical block which has not completed writing as a valid physical block can be prevented. In regard with the above-mentioned configuration, it may have a configuration which does not comprise the first flag.

The above-mentioned control method of a non-volatile memory apparatus in accordance with the present invention from still another aspect comprises a last page writing step of writing data onto all addresses of an area of a last page of the above-mentioned physical block, excluding an area for writing data which can be written singularly and separately, and filling the area with data and an ECC code and/or a CRC code of the above-mentioned data, or filling it with these data and codes as well as complementary data of the ECC code and/or the CRC code.

In regard to the present invention, when the general data is written onto thirty-one pages, and the data is written onto the last page, a pre-determined area is filled with a general data and the ECC code and/or the CRC code, or is filled with these data and codes as well as the complementary data. In an initialization process, whether the data writing is completed or not can be judged, based on the consistency of the data (the presence or absence of an error detection).

The present invention realizes a control method of a non-volatile memory apparatus which detects whether the physical block has completed the writing correctly or not, even when a power is shut down during writing. In regard with the above-mentioned configuration, it may have a configuration which does not comprise the first flag.

The above-mentioned control method of a non-volatile memory apparatus in accordance with the present invention from still another aspect further comprises an initialization step of reading out the above-mentioned data and the above-mentioned ECC codes and/or the CRC codes of the above-mentioned data, or these data and codes as well as complementary data of the ECC code and/or the CRC code, of the last pages of all the above-mentioned physical blocks of the above-mentioned non-volatile memory, executing an error detection, and generating the logical address/physical address conversion table based on presence or absence of an error at the startup of the above-mentioned non-volatile memory apparatus.

According to the present invention, an accurate logical address/physical address conversion table can be generated within a short time, even in an initialization process after a power was shut down during writing. Thereby, wrongly judging an incorrect physical block which has not completed writing as a valid physical block can be prevented.

A control method of a non-volatile memory apparatus in accordance with the present invention from still another aspect comprises: a controlling step of controlling data writing and data readout of the above-mentioned non-volatile memory, by using an erased table indicating whether a physical block which is a minimum erasing unit of data on the non-volatile memory is erased or not, and a logical address/physical address conversion table which converts the logical address to the physical address; a physical address registering step of registering the physical address of a physical block having invalid data (hereinafter be referred to as "old physical block") onto an invalid table (an erasing appointment table) existing in a management area of the above-mentioned non-volatile memory having the above-mentioned management area and a data recording area, and having a physical address of an old physical block and a third flag indicating whether invalid data of the above-mentioned old physical block is erased or not; an invalid data erasing step of erasing the invalid data of the above-mentioned old physical block; and a third flag writing step of writing a fixed value which indicates that erasing of the invalid data of the above-mentioned old physical block is completed onto the above-mentioned third flag corresponding to the physical address of the above-mentioned old physical block.

In regard to the conventional control method of a non-volatile memory apparatus, when data of a physical block is to be erased, a physical block in which a flag indicating whether the data is invalid or not is set to invalid, was erased for example. However, when a power is shut down during erasing, there was a case in which data erasing was not completed, and a bit of 0 was included. In order to know for certain whether one physical block is erased or not with consideration to such abrupt power shut down, all the bits in the 32 pages had to be checked, and must check whether all bits are 1 or whether a bit of 0 is included.

In regard to the present invention, an erasing appointment table which is configured from addresses of physical blocks to be erased and third flags is generated in a management area of the non-volatile memory, and a physical address of the physical block to be erased is registered in the erasing appointment table before the physical block is erased. Subsequently, that physical block is erased. Finally, a fixed value (00 in the embodiment) is written onto the third flag that corresponds to the erased physical block.

Therefore, even when the erasing has once started, when the power is shut down during erasing, the third flag is not a pre-determined fixed value (11 for example). When the third flag of the physical block that is registered in the erasing appointment table is not a pre-determined fixed value, it becomes apparent for certain that the erasing of that physical block has not ended. When the third flag is a pre-determined fixed value (00 for example), the erasing of that physical block is completed for certain.

The present invention realizes a control method of a non-volatile memory apparatus which detects for certain whether the erasing of a physical block is ended or not, even when a power is shut down during erasing.

The above-mentioned control method of a non-volatile memory apparatus in accordance with the present invention from still another aspect further comprises: an invalid data erasing step of reading out the above-mentioned invalid table of the above-mentioned management area, and erasing the invalid data of the above-mentioned old physical block, the above-mentioned third flag corresponding to which is not written, at the startup of the above-mentioned non-volatile memory apparatus; and a third flag writing step of writing a fixed value, which indicates that erasing of the invalid data of the above-mentioned old physical block is completed, onto the above-mentioned third flag that corresponds to the physical address of the above-mentioned old physical block.

The present invention realizes a control method of a non-volatile memory apparatus which detects for certain at the startup that erasing of the physical block has not completed, even when a power was shut down during erasing and thus the erasing of the physical block has not completed, and erases the physical block. Thereby, wrongly writing data to a physical block which is not erased can be prevented.

A control method of a non-volatile memory apparatus in accordance with the present invention from still another aspect comprises: a controlling step of controlling data writing and data readout of the above-mentioned non-volatile memory, by using an erased table indicating whether a physical block which is a minimum erasing unit of data of the non-volatile memory is erased or not, and a logical address/physical address conversion table which converts the logical address to the physical address; a physical address registering step of registering a physical address of an old physical block having invalid data onto a redundancy area of a pre-determined page of the physical block when data is written onto the above-mentioned physical block, wherein the pre-determined page is within a plurality of pages which are included in the above-mentioned physical block, have data areas and the above-mentioned redundancy areas, and each of which is a minimum data writing unit; an invalid data erasing step of erasing invalid data of the above-mentioned old physical block; and a third flag writing step of writing a fixed value, which indicates that erasing of invalid data of the above-mentioned old physical block is completed, onto a third flag existing in the above-mentioned redundancy area in which the physical address of the above-mentioned old physical block is registered, and indicating whether invalid data of the above-mentioned old physical block is erased or not.

The present invention realizes a control method of a non-volatile memory apparatus which detects for certain whether the erasing of a physical block is ended or not, even when a power is shut down during erasing. The present invention does not need to provide an exclusive area for creating an erasing appointment table in the management area of the non-volatile memory, since the physical address of the old physical block and the third flag is written onto the redundancy area of the physical block of a writing destination. Since the physical address of the old physical block is registered simultaneously with the data writing of a pre-determined page of a physical block, there would not be an excess time necessary for registering the physical address, and the processing time would be short compared with the method providing an erasing appointment table.

The above-mentioned control method of a non-volatile memory apparatus in accordance with the present invention from still another aspect further comprises: an invalid data erasing step of reading out the above-mentioned third flag of the redundancy area of the above-mentioned physical block, and erasing invalid data of the above-mentioned old physical block, the above-mentioned third flag corresponding to which is not written, at the startup of the above-mentioned non-volatile memory apparatus; and a third flag writing step of writing the fixed value, which indicates that erasing of invalid data of the above-mentioned old physical block has completed, onto the above-mentioned third flag.

The present invention realizes a control method of a non-volatile memory apparatus which detects for certain at the startup that erasing of the physical block has not ended, even when a power is shut down during erasing and thus the erasing of the physical block has not ended, and erases the physical block. Thereby, wrongly writing data to a physical block which is not erased can be prevented.

A control method of a non-volatile memory apparatus in accordance with the present invention from still another aspect comprises a controlling step of controlling data writing and data readout of data of the above-mentioned non-volatile memory, by using an erased table indicating whether the physical block which is a minimum erasing unit of data on a non-volatile memory is erased or not, and a logical address/physical address conversion table which converts the logical address to the physical address; and an old data erasing step of erasing the data written onto the above-mentioned physical block every time before writing data onto the above-mentioned physical block, after the above-mentioned physical block to execute the data writing is determined.

According to the present invention, accidents of wrongly writing data onto a physical block which is not yet erased can be prevented.

A control method of a non-volatile memory apparatus in accordance with the present invention from still another aspect comprises: a controlling step of controlling the data writing and data readout of the above-mentioned non-volatile memory, by using an erased table indicating whether the physical block which is the minimum erasing unit of data of a non-volatile memory is erased or not, and a logical address/physical address conversion table which converts the logical address to the physical address; and an old data erasing step of reading out the first page before writing data onto the above-mentioned physical block, wherein the first page is within a plurality of pages which are included in the above-mentioned physical block and have data areas and redundancy areas, and each of which is a minimum data writing unit, and judging whether the above-mentioned first page is erased or not based on the management information of the physical block provided to the above-mentioned redundancy area of the above-mentioned first page, and erasing the data written onto the above-mentioned physical block when the first page is not erased.

According to the present invention, an accident of wrongly writing data onto a physical block which is not yet erased can be prevented positively and efficiently.

The novel features of the invention are set forth with particularity in the appended claims. The invention as to both structure and content, and other objects and features thereof will best be understood from the detailed description when considered in connection with the accompanying drawings.

BRIEF DESCRIPTION OF DRAWINGS

FIG. 2 shows the configuration of an erased table 105.

FIG. 3 shows the configuration of a logical address/physical address conversion table 106.

FIG. 5 shows the configuration of a physical block of a non-volatile memory 103 in accordance with the first embodiment of the present invention.

FIG. 6 is a flowchart of a data rewriting method of a non-volatile memory apparatus 101 in accordance with the first embodiment of the present invention.

FIG. 7 shows the status of data being written onto a physical block in stages in accordance with the first embodiment of the present invention.

FIG. 8 shows the configuration of a physical block of a non-volatile memory 103 in accordance with the second embodiment of the present invention.

FIG. 10 shows the status of data being written onto a physical block in stages in accordance with the second embodiment of the present invention.

FIG. 11 is a flowchart of an initialization process of a non-volatile memory apparatus 101 in accordance with the second embodiment of the present invention.

FIG. 17 shows the status transition of an erasing appointment table in stages in accordance with the fifth embodiment of the present invention.

FIG. 19 shows the configuration of a physical block of a non-volatile memory 103 in accordance with the sixth embodiment of the present invention.

FIG. 21 is a flowchart of an initialization process of a non-volatile memory apparatus 101 in accordance with the sixth embodiment of the present invention.

Part or all of the drawings are drawn schematically for diagrammatic representation and it should be considered that they do not necessarily reflect relative size and position of components shown therein.

BEST MODE FOR CARRYING OUT THE INVENTION

Embodiments that specifically show the best mode for conducting the present invention will be described below with reference to figures.

FIRST EMBODIMENT

Figure 1:
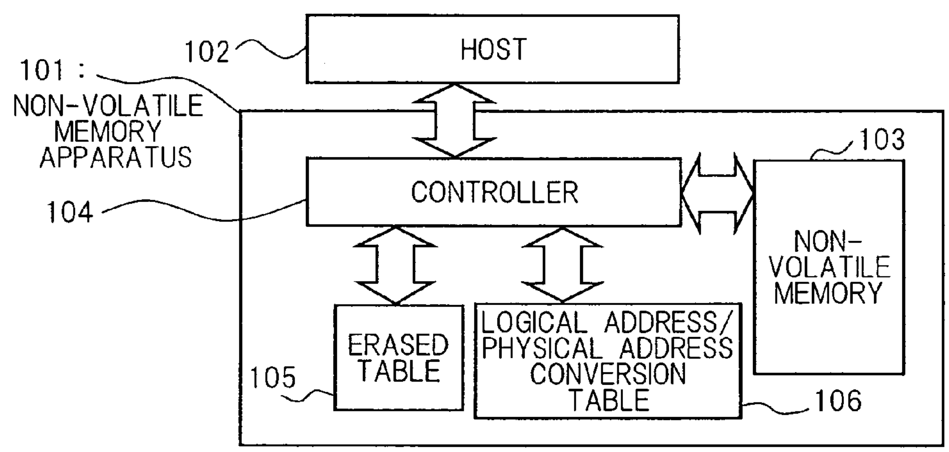
FIG. 1 is a block diagram showing the configuration of a non-volatile memory apparatus.

Non-volatile memory apparatus in accordance with the first embodiment will be described with reference to FIG. 1 through FIG. 7. In FIG. 1, a reference numeral 101 denotes a non-volatile memory apparatus, a reference numeral 102 denotes a host. A non-volatile memory apparatus 101 has a non-volatile memory 103, a controller 104, an erased table 105, and a logical address/physical address conversion table 106. In the first embodiment, the non-volatile memory apparatus 101 is a memory card, the host 102 is a cellular phone, and the non-volatile memory 103 is a flash memory. Since FIG. 1 through FIG. 4 are identical to the conventional art, its detailed description will be omitted.

FIG. 5 shows the configuration of a physical block of a non-volatile memory 103 in accordance with the present invention. A physical block 501 consists of 32 pages. The capacity of a single page is 528 bytes, and is divided into a data area 502 of 512 bytes and a redundancy area 503 of 16 bytes. A single page is a data writing unit and a data readout unit. In data writing, the data is written in order in a page unit from page 0 to page 31 of the physical block. Physical block is a data erasing unit, and erases all 32 pages contained in the physical block simultaneously when the data is to be erased.

The data on the physical block 501 of a non-volatile memory are represented in terms of 1 and 0, and all the bits are 1 when it is in an erased status. Data writing means writing 0, and 1 can not be overwritten on a bit of 0. Therefore, when a new data is overwritten on a physical block which is not erased, it becomes an incorrect data. The new data must be written onto an erased physical block.

Difference of the physical block in accordance with the first embodiment from the configuration of a physical block in the conventional art (FIG. 24) is that it has a first flag 511 in the redundancy area 503 of page 0 which is the first page. The first flag 511 is represented in a plurality of bit data in order to enhance data reliability. In the first embodiment, the first flag is comprised of two bits, and is represented with a logic value 11 or 00. In other points, the physical block in accordance with the first embodiment of the present invention is identical to the configuration of a physical block in the conventional art.

Data rewriting method of a non-volatile memory apparatus 101 in accordance with the first embodiment will be described with reference to FIG. 6 and FIG. 7. FIG. 6 is a flowchart of a data rewriting method of a non-volatile memory apparatus 101 in accordance with the first embodiment. FIG. 7 shows the status of data being written onto a physical block in stages in accordance with the first embodiment.

When a data writing command is received from the host 102, the controller 104 of the non-volatile memory apparatus 101 detects an erased physical block from the erased table 105, and secures it as a physical block of a writing destination (step 601). All the bits of the physical block 501 of the non-volatile memory 103 are 1 when it is in an erased status (part (a) of FIG. 7).

Initially, a fixed value (a value which is different from the value when it is erased; 00 in the embodiment) is written onto the first flag of the secured physical block (step 602, part (b) of FIG. 7). More specifically, data in which only the first flag is 00 and all other data are 1 is written onto the first page. In the physical block of the writing destination, only a part of the redundancy area 503 of the first page (the first flag 511) turns into a written status. The first flag 511 indicates that data writing will start hereafter in that physical block. Subsequently, the data other than the first flag is written in a page unit in order from page 0 to page 31 of the physical block (step 603, part (c) of FIG. 7).

The old physical block containing invalid data (data which became unnecessary as a result from writing a new data) is erased (step 604). The erased table 105 and the logical address/physical address conversion table 106 are updated (step 605). More specifically, 0 (written) is written onto a bit corresponding to the physical block which was secured in step 601, in the erased table 105. 1 (erased) is written onto the bit corresponding to the old physical block which was erased in step 604. The physical address corresponding to the logical address in the logical address/physical address conversion table 106 is updated so as to indicate the physical block in which the writing from the old physical block was executed.

The writing method in accordance with the first embodiment which writes the first flag in a different step has one extra step of process than the writing method of a conventional art. However, when writing a single page (a minimum writing unit) is executed in a single step for example, the number of writing steps that is necessary for writing a single physical block (32 pages) only becomes 33 steps, which is one extra step than the conventional 32 steps.

For example, since the time for transmitting data of a single page to a non-volatile memory 103 is 40 μs, and the time for data writing a single page is 200 μs, the time for writing a single physical block is (40+200)×32=7680 μs. By contrast, since the time for transmitting only the data of a redundancy area of a single page is 1.5 μs, and the time for data writing a single page is 200 μs, the time for data writing only the data of a redundancy area of a single page is 1.5+200=201.5 μs. Therefore, the time for data writing in accordance with the first embodiment (201.5 μs+7680 μs) is only about 2.6% longer than the conventional art (7680 μs). In the embodiment, the data writing speed is by far faster than the conventional art 1 which always writes the address, data and the like in two places. When the number of writing steps for a single page is a plurality of steps rather than a single step, the rate of a slowdown in the processing speed due to writing the first flag in a different step will furthermore be small.

Figure 4:
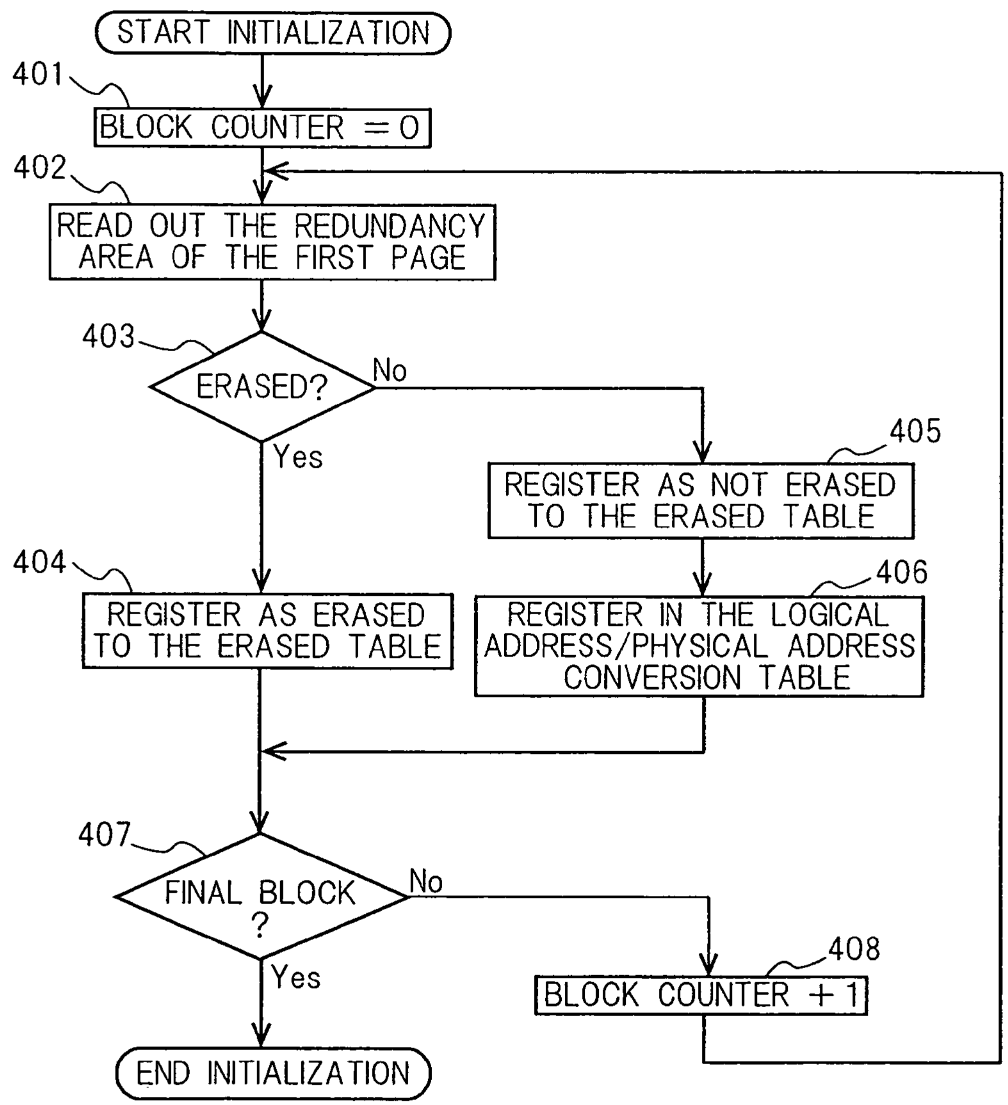
FIG. 4 is a flowchart of an initialization process of a non-volatile memory apparatus 101 in accordance with the conventional art and the first embodiment of the present invention.

The initialization process in accordance with the first embodiment will be described with reference to FIG. 4. FIG. 4 is a flowchart of an initialization process of a non-volatile memory apparatus 101 in accordance with the conventional art, and the first embodiment of the present invention executes the initialization process in an identical method as that of the conventional art. In regard to all the physical blocks of a non-volatile memory 103, the redundancy area 503 of the first page is read out (step 402), and judged whether the physical block is erased or not (step 403). As to the judgment of whether the physical block is erased or not, it is judged as erased when all of the redundancy area 503 of the first page are data of 1, and it is judged as written when data which includes a bit of value 0 is written.

In the first embodiment of the present invention, value 00 is already written onto the first flag even in the physical block in which data writing was interrupted by an abnormal conditions such as a power shut down, since a fixed value is written to the first flag before writing the data (step 602). For example, even in a physical block where process was interrupted during data writing to the first page, the first flag is 00. Therefore, a non-volatile memory apparatus 101 in accordance with the first embodiment will not wrongly judge the physical block in which data writing was interrupted (not erased completely) as erased, and will not register the physical block in the erased table 105.

According to the control method of a non-volatile memory apparatus in accordance with the first embodiment of the present invention, it can detect for certain whether a physical block is erased or not, using the same initialization process as that of the conventional art, by writing the first flag before the data. Even when data writing is interrupted by a power shut down and the like, the erased table 105 can be generated correctly, and wrongly writing data onto the physical block which is not erased can be prevented.

SECOND EMBODIMENT

Figure 24:
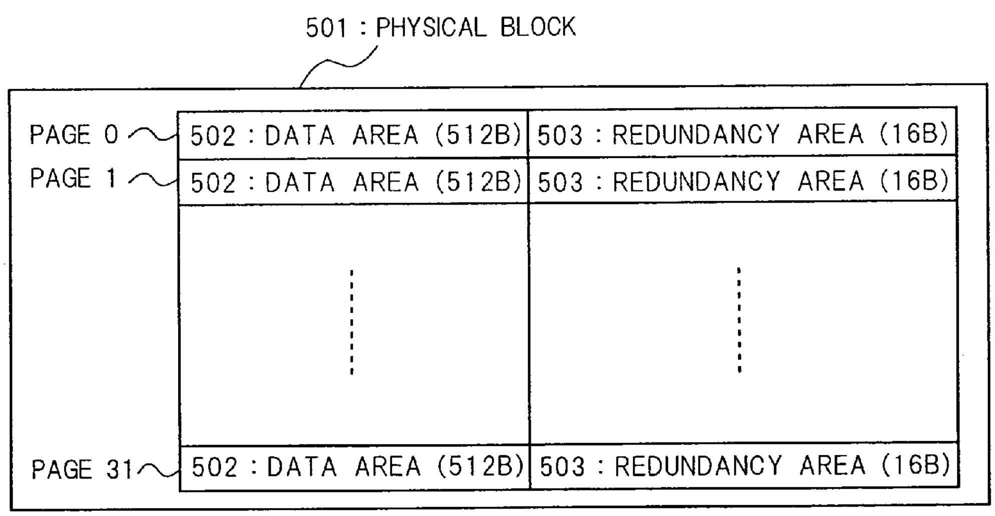
FIG. 24 shows the configuration of a physical block of a non-volatile memory 103 in the conventional art.

The control method of a non-volatile memory apparatus in accordance with the second embodiment will be described with reference to FIG. 1 through FIG. 3 and FIG. 8 through FIG. 11. Since FIG. 1 through FIG. 3 are identical with the conventional art and the first embodiment, its description will be omitted. FIG. 8 shows the configuration of a physical block of a non-volatile memory 103 in accordance with the second embodiment of the present invention. In FIG. 8, an identical numeral is affixed to parts identical with the conventional art (FIG. 24).

Difference of the physical block in accordance with the second embodiment from the configuration of a physical block in the conventional art is that it has a second flag 801 in the redundancy area 503 of a pre-determined page (page 31 which is the last page, in the second embodiment). The second flag 801 is represented in a plurality of bit data in order to enhance data reliability. In the second embodiment, the second flag is comprised of two bits, and is represented with a logic value 11 or 00. In other points, the physical block in accordance with the second embodiment of the present invention are identical to the configuration of a physical block in the conventional art.

Figure 9:
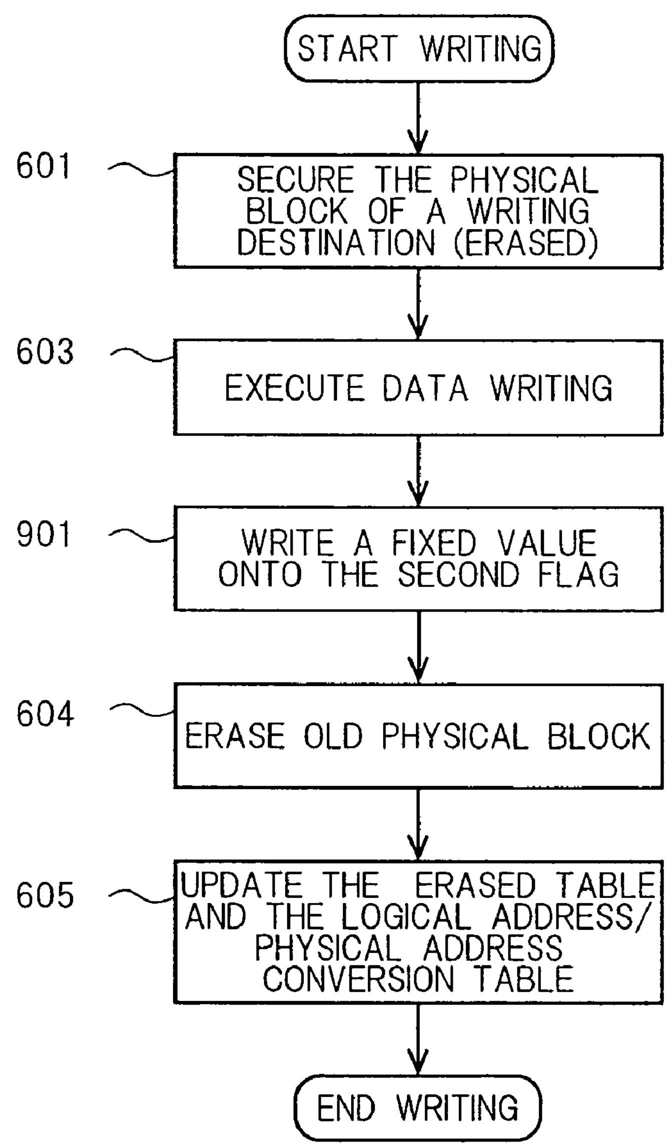
FIG. 9 is a flowchart of a data rewriting method of a non-volatile memory apparatus 101 in accordance with the second embodiment of the present invention.

The data rewriting method of a non-volatile memory apparatus 101 in accordance with the second embodiment will be described with reference to FIG. 9 and FIG. 10. FIG. 9 is a flowchart of a data rewriting method of a non-volatile memory apparatus 101 in accordance with the second embodiment. In FIG. 9, an identical numeral is affixed to steps identical with FIG. 6 of the first embodiment. FIG. 10 shows the status of data being written onto a physical block in stages in accordance with the second embodiment.

When data writing command is received from the host 102, the controller 104 of the non-volatile memory apparatus 101 detects an erased physical block from an erased table 105, and secures it as a physical block of a writing destination (step 601). The bits of the physical block 501 of the non-volatile memory 103 are all 1 when it is in an erased status (part (a) of FIG. 10).

Data is written onto the secured physical block in a page unit (step 603, part (b) of FIG. 10). More specifically, the data is written in order from page 0 to page 30. The data other than the second flag is written onto page 31. More specifically, a desired data is written onto the last page with the second flag as 11. As a result, the physical block of the writing destination are all in a written status except a part of the redundancy area 503 of the last page (the second flag 801).

Lastly, a fixed value (a value which is different from the value when it is erased; 00 in the embodiment) is written onto the second flag (step 901, part (c) of FIG. 10). More specifically, data in which only the second flag is 00 and all other data are 1 is written onto the last page. When the writing of the second flag is completed, the writing of that physical block is completed. The second flag 801 indicates that data writing of the physical block is completed.

An old physical block which includes invalid data (data which became unnecessary as a result from writing a new data) is erased (step 604).

The erased table 105 and the logical address/physical address conversion table 106 are updated (step 605). More specifically, 0 (written) is written onto a bit corresponding to the physical block which was secured in step 601, in the erased table 105. 1 (erased) is written onto the bit corresponding to the old physical block which was erased in step 604. The physical address which corresponds to the logical address of the logical address/physical address conversion table 106 is updated so as to indicate the physical block in which the writing from the old physical block was executed.

The writing method in accordance with the second embodiment which writes the second flag in a different step has one extra step of process than the writing method of a conventional art. However, when writing a single page (a minimum writing unit) is executed in a single step for example, the number of writing steps that is necessary for writing a single physical block (32 pages) only becomes 33 steps, which is one extra step than the conventional 32 steps.

For example, since the time for transmitting data of a single page to a non-volatile memory 103 is 40 μs, and the time for data writing a single page is 200 μs, the time for writing a single physical block is (40+200)×32=7680 μs. By contrast, since the time for transmitting only the data of a redundancy area of a single page is 1.5 μs, and the time for data writing a single page is 200 μs, the time for writing only the data of a redundancy area of a single page is 1.5+200=201.5 μs. Therefore, the time for data writing in accordance with the second embodiment (7680 μs+201.5 μs) is only about 2.6% longer than the conventional art (7680 μs). In the embodiment, the data writing speed is by far faster than the conventional art 1 which always writes an address, data and the like in two places. When the number of writing steps for a single page is a plurality of steps rather than a single step, the rate of a slowdown in the processing speed due to writing the second flag in a different step will furthermore be small.

The initialization process in accordance with the second embodiment will be described with reference to FIG. 11. FIG. 11 is a flowchart of an initialization process of a non-volatile memory apparatus 101 in accordance with the second embodiment. In FIG. 11, an identical numeral is affixed to steps identical with FIG. 4 (the conventional art and the first embodiment).

0 (initial value) is set in a block counter (step 401). The controller 104 reads out the redundancy area 503 of the first page of a physical block which is the target for read out of a non-volatile memory 103 (step 402).

The physical block is judged whether it is erased or not (step 403). As to the judgment of whether the physical block is erased or not, its judgment is made by whether the redundant area 503 of the first page are all data of 1, or whether data which includes a bit of value 0 is written, as with the conventional art.

When all of the redundancy area 503 of the first page is data of 1, the physical block is judged as erased, 1 is written to a column corresponding to the physical block in the erased table 105, and registers the physical block as erased (step 404). It proceeds to step 407.

When data which includes a bit of value 0 is written onto the redundancy area of the first page, it is judged as written, and the redundancy area of the last page having the second flag is read out (step 1101). Whether the second flag is written or not is judged (step 1102). When the second flag is not written (=11), that physical block is judged as not having completed the data writing due to a power shut down and the like, erases the physical block (step 1103), and proceeds to step 404.

When the second flag is written (=00), 0 (not erased) is written onto the physical block column in the erased table 105 (step 405). The logical address written onto the redundancy area 503 of the first page is read out, and a physical address is registered in the place corresponding to its logical address in the logical address/physical address conversion table 106 (step 406). It proceeds to step 407.

Whether it is a final physical block or not is judged (step 407). When it is not a final physical block, 1 is added to the block counter (step 408), returns to step 402 and the process is repeated. When it is a final physical block, initialization is ended.

The control method of a non-volatile memory apparatus in accordance with the second embodiment will not wrongly register an incomplete physical block in which data writing was interrupted in the logical address/physical address conversion table 106. For example, when the writing process was interrupted by a power shut down and the like, the second flag is still 11. Even when the first page is written, it can be judged that writing has not completed to the last page. When the second flag is 00, it can be judged that the writing of that physical block is completed.

According to the control method of a non-volatile memory apparatus in accordance with the second embodiment of the present invention, a logical address/physical address conversion table 106 can be generated correctly based on the second flag even when data writing was interrupted at midpoint by a power shut down and the like.

In regard to the second embodiment, the second flag 801 is disposed in the last page of a physical block. Instead, the second flag can be disposed in the redundancy area 503 of an arbitrary page other than the last page of a physical block. In this case, it needs only to read out the redundancy area of the page having the second flag instead of the last page, in step 1101 of the initialization process of FIG. 11.

THIRD EMBODIMENT

Figure 12:
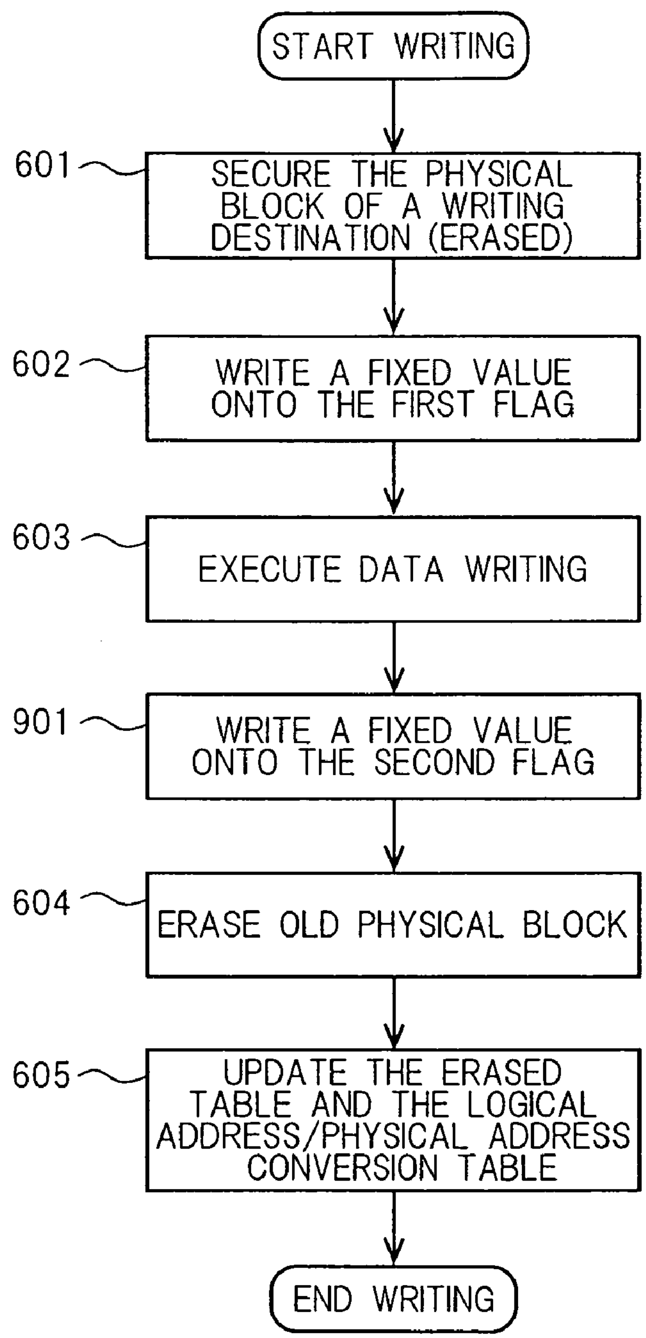
FIG. 12 is a flowchart of a data rewriting method of a non-volatile memory apparatus 101 in accordance with the third embodiment of the present invention.

The control method of a non-volatile memory apparatus in accordance with the third embodiment will be described with reference to FIG. 11 and FIG. 12. The physical block 501 of the non-volatile memory 103 in accordance with the third embodiment has both the first flag and the second flag. The first flag 511 and the second flag 801 which the physical block in accordance with the third embodiment has are identical to the first flag 511 in accordance with the first embodiment and the second flag 801 in accordance with the second embodiment, respectively.

Data rewriting method of a non-volatile memory apparatus 101 in accordance with the third embodiment will be described with reference to FIG. 12. FIG. 12 is a flowchart of a data rewriting method of a non-volatile memory apparatus 101 in accordance with the third embodiment. In FIG. 12, an identical numeral is affixed to steps identical with FIG. 6 of the first embodiment and FIG. 9 of the second embodiment.

When a data writing command is received from the host 102, the controller 104 of the non-volatile memory apparatus 101 detects an erased physical block from an erased table 105, and secures it as a physical block of a writing destination (step 601). The bits of the physical block 501 of the non-volatile memory 103 are all 1 when it is in an erased status (part (a) of FIG. 7).

Initially, a fixed value (00 in the embodiment) is written onto the secured physical block (step 602, part (b) of FIG. 7). In the physical block of the writing destination, only a part of the redundancy area 503 of the first page (the first flag 511) turns into a written status. The first flag 511 indicates that data writing will be started hereafter in that physical block.

Subsequently, data is written onto the secured physical block in a page unit (step 603, part (c) of FIG. 7). More specifically, the data other than the first flag is written in page 0. Data is written in order from page 1 to page 30. The data other than the second flag is written onto page 31 (part (b) of FIG. 10).

Lastly, a fixed value (00 in the embodiment) is written onto the second flag (step 901, part (c) of FIG. 10). When the writing of the second flag is completed, the writing of that physical block is completed. The second flag 801 indicates that data writing of the physical block is completed.

An old physical block which includes invalid data (data which became unnecessary as a result from writing a new data) is erased (step 604).

The erased table 105 and the logical address/physical address conversion table 106 are updated (step 605). More specifically, 0 (written) is written onto a bit corresponding to the physical block which was secured in step 601, in the erased table 105. 1 (erased) is written onto the bit corresponding to the old physical block which was erased in step 604. The physical address corresponding to the logical address of the logical address/physical address conversion table 106 is updated so as to indicate the physical block in which the writing from the old physical block was executed.

The initialization process in accordance with the third embodiment will be described with reference to FIG. 11. The third embodiment executes the initialization process in an identical method as that of the second embodiment. In step 402, the redundancy area 503 of only the first page of a physical block is read out. As to the judgment of whether the physical block of step 403 is erased or not, it is judged as erased when the redundancy area 503 of the first page are all data of 1, and it is judged as written when data which includes a bit of value 0 is written.

When the redundancy area 503 of the first page are all data of 1, in other words when a fixed value is not written onto the first flag, 1 is written to its physical block column in the erased table 105, and registers the physical block as erased (step 404).

When the redundancy area 503 is not erased, in other words when a fixed value is written onto the first flag, the redundancy area of the last page is read out (step 1101). Whether the second flag which is disposed in the redundancy area of the last page is written or not is judged (step 1102). When the second flag is not written (=11), that physical block is judged as not having completed the writing due to a power shut down and the like, erases the physical block (step 1103), and proceeds to step 404.

When the second flag is written (=00), 0 (not erased) is written onto its physical block column in the erased table 105. The logical address written onto the redundancy area 503 of the first page is read out, and a physical address is registered in the place corresponding to its logical address of the logical address/physical address conversion table 106 (step 406). It proceeds to step 407.

Therefore, the status of a physical block in accordance with the third embodiment can be judged as follows.

In a case where the first flag=11 and the second flag=11, it indicates that the physical block is erased (unwritten).

In a case where the first flag=00 and the second flag=11, it indicates that data writing is interrupted at midpoint due to a power shut down and the like, and that data writing has started but not completed.

In a case where the first flag=11 and the second flag=00, it would not occur in a normal process.

In a case where the first flag=00 and the second flag=00, it indicates that the physical block is written.

According to the control method of a non-volatile memory apparatus in accordance with the third embodiment of the present invention, it can detect for certain whether a physical block is erased or not, by writing the first flag before the data.

According to the control method of a non-volatile memory apparatus in accordance with the third embodiment of the present invention, it can detect for certain whether a physical block is written or not, by writing the second flag after the data.

According to the control method of a non-volatile memory apparatus in accordance with the third embodiment of the present invention, both an erased table 105 and a logical address/physical address conversion table 106 can be generated correctly based on the first flag and the second flag even when data writing was interrupted at midpoint by a power shut down and the like. The third embodiment has both the effect of the first embodiment and the effect of the second embodiment.

In regard to the third embodiment, the second flag 801 is disposed in the last page of a physical block. Instead, the second flag can be disposed in the redundancy area 503 of an arbitrary page other than the last page of a physical block. In this case, it needs only to read out the redundancy area of the page having the second flag instead of the last page, in step 1101 of the initialization process of FIG. 11.

By writing the first flag and the second flag in other steps, the correctness of the erased table 105 and the logical address/physical address conversion table 106 generated in the initialization process improves. However, in the writing method in accordance with the third embodiment, the time necessary for writing is long since there is 2 extra steps of process than the writing method of a conventional art, and one extra step of process than the writing method of the first embodiment or the second embodiment. For example, since the time for writing a single physical block is 7680 μs, and the time for writing only the data of a redundancy area of a single page is 201.5 μs, the time for data writing in accordance with the third embodiment is about 5.2% longer than the conventional art, and about 2.6% longer than the first embodiment or the second embodiment.

Depending on whether to give priority to reducing the time necessary for data writing and the time necessary for initialization process, or to give priority to the correctness of the erased table 105 and the logical address/physical address conversion table 106, it can have only the first flag (the first embodiment), or it can have only the second flag (the second embodiment), or it can have both the first flag and the second flag (the third embodiment).

FOURTH EMBODIMENT

Figure 13:
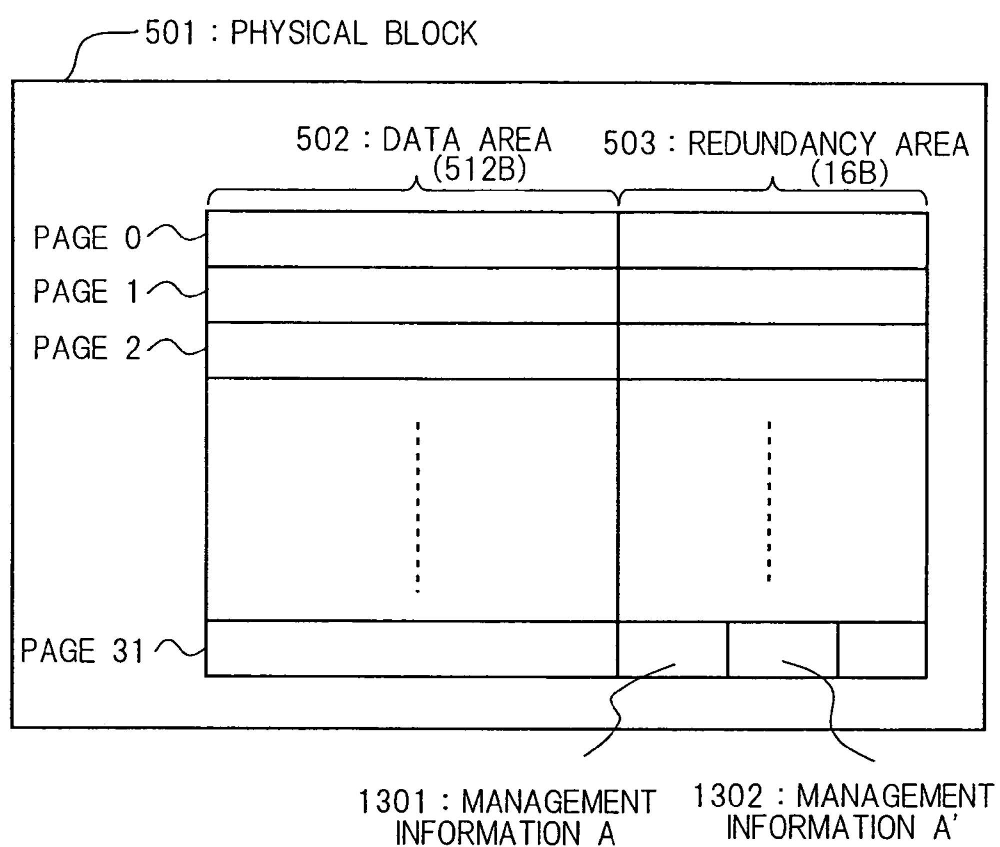
FIG. 13 shows the configuration of a physical block of a non-volatile memory 103 in accordance with the fourth embodiment of the present invention.

The control method of a non-volatile memory apparatus in accordance with the fourth embodiment will be described with reference to FIG. 13. FIG. 13 shows the configuration of a physical block of a non-volatile memory 103 in accordance with the fourth embodiment. Difference of the physical block 501 in accordance with the fourth embodiment from the configuration of a physical block in the second embodiment is that it has a management information A1301 and a management information A'1302 in the last page, instead of a second flag 801. In other points, the physical block in accordance with the fourth embodiment is identical to that of the second embodiment.

In regard to the fourth embodiment, management information A1301 is data unique to each physical block, and includes an ECC code and/or a CRC code for example. Management information A'1302 is data in which each bit of the management information A has inverted (complementary data).

An ECC code and a CRC code may be an ECC code and a CRC code of only the data of the redundancy area 503 of the last page, or it may be an ECC code and a CRC code of the data of the data area (or the data area and the redundancy area).

It is preferable to write data onto all the addresses of the area of the last page of the physical block, excluding the area for writing data which can be written singularly and separately (for example the second flag and the like), and fill that area with data and the ECC code and/or the CRC code as well as the complementary data of the ECC code and/or the CRC code. Thereby, the probability of a wrong judgment resulting from the instantaneous power failure of a power source can be reduced furthermore.

Figure 25:
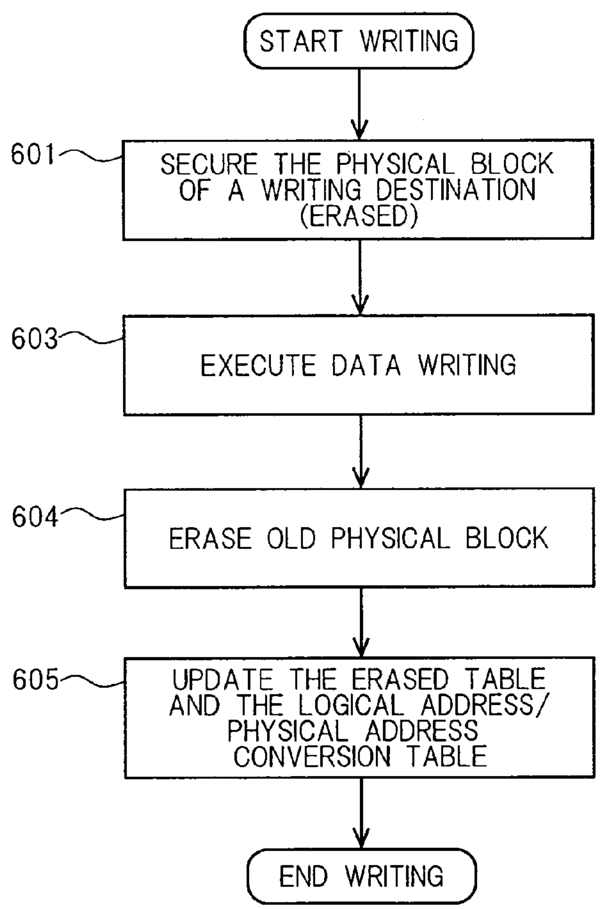
FIG. 25 is a flowchart of a data rewriting method of a non-volatile memory apparatus 101 in the conventional art.

Data rewriting method of a non-volatile memory apparatus 101 in accordance with the fourth embodiment will be described. Data rewriting method of a non-volatile memory apparatus 101 in accordance with the fourth embodiment is executed using an identical flowchart as that of FIG. 25 of the conventional art. However, the process of step 603 is different. In the non-volatile memory apparatus 101 in accordance with the fourth embodiment, it writes a management information A and a management information A' onto the redundancy area 503 simultaneously as it writes data onto a data area 502 of page 31 which is the last page, when data is written onto the physical block 501. Since it is identical with the data rewriting method of the conventional art in other points, its description will be omitted.

The initialization process of a non-volatile memory apparatus in accordance with the fourth embodiment will be described with reference to FIG. 11. In the initialization process of the fourth embodiment, step 1101 and step 1102 differs from the second embodiment. In the second embodiment, only the redundancy area of the last page is read out (step 1101), and whether data is written onto the physical block 501 is judged based on whether the second flag 801 is written or not (step 1102). In the fourth embodiment, the data area and the redundancy area of the last page is read out (step 1101). Whether there is an error in the last page or not, and furthermore, whether there is a complementary relation between the management information A and the management information A' or not (whether it is consistent, or includes an error), is judged from the data and the ECC codes and/or the CRC codes (step 1102). When the data and the ECC codes and/or the CRC codes consist, and when the management information A and the management information A' is a complementary data, the physical block is judged as written, and proceeds to step 405. When the data and the ECC codes and/or the CRC codes does not consist, or when-the management information A and the management information A' is not a complementary data (includes an error), the writing of the physical block is judged as interrupted at midpoint due to a power shut down and the like, and proceeds to step 404 after the physical block is erased in step 1103. Since it is identical with the initialization process in accordance with the second embodiment in other points, its description will be omitted.

According to the control method of a non-volatile memory apparatus in accordance with the fourth embodiment, an excessive program time for writing a complementary data is unnecessary since it writes the complementary data (the management information A and the management information A') onto the redundancy area 503 simultaneously as it writes data onto a data area 502. The processing time is short when compared with the second embodiment which writes the second flag 801 in a different step after the data is written onto the physical block 501. However, the possibility of a wrong judgment in regard to the control method in the fourth embodiment is not zero though extremely close to zero, and the control method in the second embodiment is superior as to the reliability of accuracy.

Depending on whether to give priority to reducing the time necessary for data writing, or to give priority to the correctness of the erased table 105 and the logical address/physical address conversion table 106, it can have the second flag (the second embodiment), or it can have a complementary data (the fourth embodiment).

Instead of the above-mentioned method, it can have only the ECC codes and/or the CRC codes on the redundancy area of the last page, without having a management information A' 1302. It is preferable to write data onto all the addresses of the area of the last page of the physical block, excluding the area for writing data which can be written singularly and separately (for example a second flag and the like), and fill that area with data and the ECC code and/or the CRC code. Thereby, the probability of a wrong judgment resulting from the instantaneous power failure of a power source can be reduced furthermore.

The ECC code and/or the CRC code are written onto the redundancy area 503 simultaneously as data is written onto a data area 502 of page 31 which is the last page of the physical block 501. In other points, the data rewriting method is identical to that of the conventional art.

The initialization process of a non-volatile memory apparatus in a case where it does not have a management information A' will be described with reference to FIG. 11. The data area and the redundancy area of the last page is read out (step 1101). Whether there is an error in the data of the last page or not is judged from the data and the ECC code and/or CRC code (step 1102). When the data and the ECC code and/or the CRC code consist, the physical block is judged as written, and proceeds to step 405. When the data and the ECC code and/or the CRC code does not consist, the writing of the physical block is judged as interrupted at midpoint due to a power shut down and the like, and proceeds to step 404 after the physical block is erased in step 1103. Since it is identical with the above-mentioned initialization process which does have the management information A' 1302 in other points, its description will be omitted.

FIFTH EMBODIMENT

The control method of a non-volatile memory apparatus in accordance with the fifth embodiment will be described with reference to FIG. 14 through FIG. 18. The control method of a non-volatile memory apparatus in accordance with the first embodiment through the fourth embodiment was a method to cope with a case in which a power shut down occurs during data writing. The control method of a non-volatile memory apparatus in accordance with the fifth embodiment is a method which can cope with a case in which a power shut down occurs during data erasing.

In regard to step 604 of the conventional art (FIG. 25), when a power shut down occurs in midst of erasing the old physical block, there is a possibility that the erasing of that old physical block has not completed. When initialization process is executed as the power is turned on again under this situation, there is a possibility of wrongly judging an old physical block which is not erased completely (for example, a physical block in which the redundancy area of the first page is erased, and other data are written) as erased, and registers the old physical block in the erased table 105. On the other hand, there is a possibility of wrongly judging an old physical block which is not erased completely (for example, a physical block in which the redundancy area of the first page is written, and other data are erased) as written, and registers the old physical block in the logical address/physical address conversion table 106.

In order to prevent a wrong judgment such as the above-mentioned, the control method of a non-volatile memory apparatus in accordance with the fifth embodiment realizes a method which can cope with a case in which a power shut down occurs during data erasing. The control method of a non-volatile memory apparatus 101 in accordance with the fifth embodiment comprises an erasing appointment table for judging whether the old physical block is erased or not, in the non-volatile memory.

Figure 14:
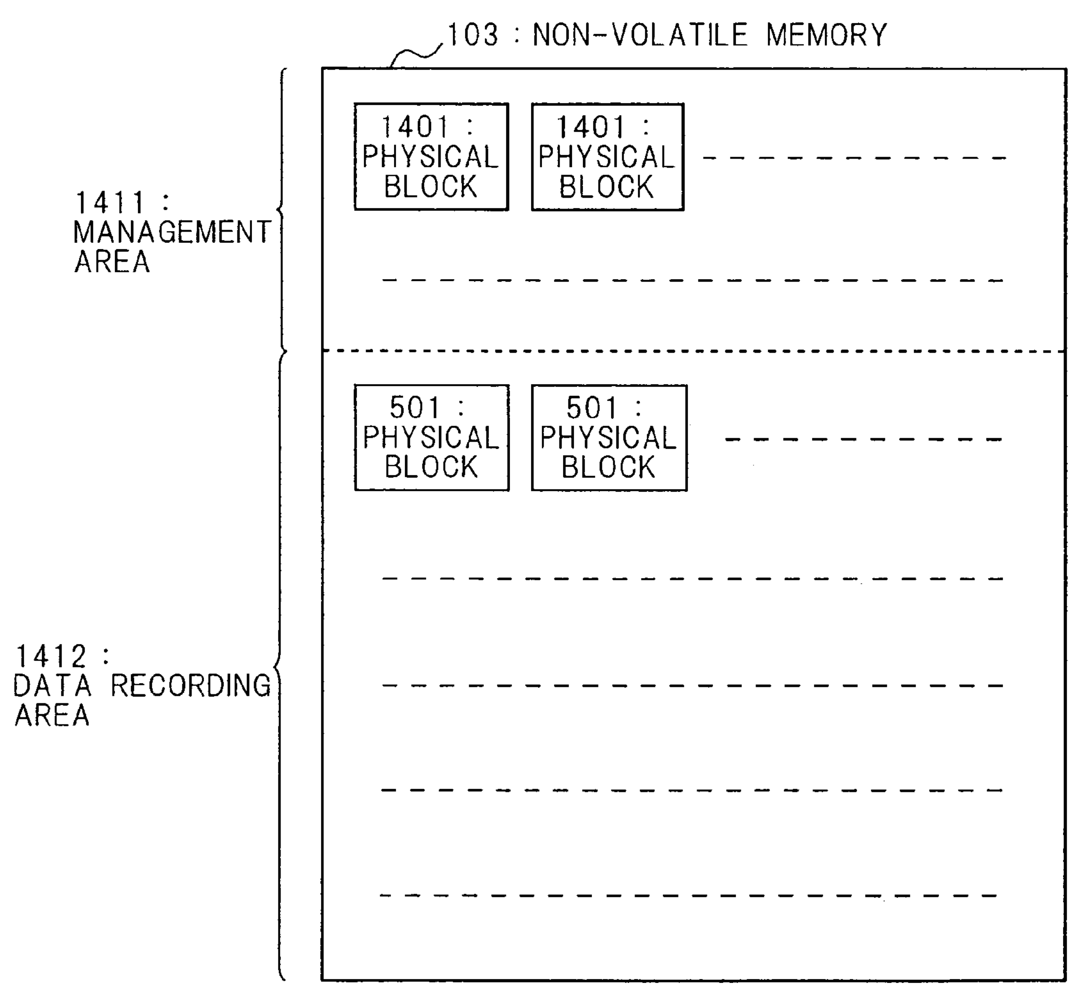
FIG. 14 shows the configuration of a non-volatile memory 103 in accordance with the fifth embodiment of the present invention.

FIG. 14 shows the configuration of a non-volatile memory. A non-volatile memory 103 is divided into a management area 1411 and a data recording area 1412. The data recording area 1412 is an area for a writing data. In regard to the fifth embodiment, the physical block 501 of the data recording area 1412 is identical to the physical block 501 of the conventional art (FIG. 24). The management area 1411 is an area for recording management information of a non-volatile memory 103, and allocates the physical block 1401 of the management area 1411 to the erasing appointment table. The management area 1411 and the data recording area 1412 needs only to be clearly distinguishable by the controller 104, and does not need to have the management area 1411 occupy the fixed physical block within the non-volatile memory 103. It may not be subjected to a fixed physical block, and may alter its area freely.

Figure 15:
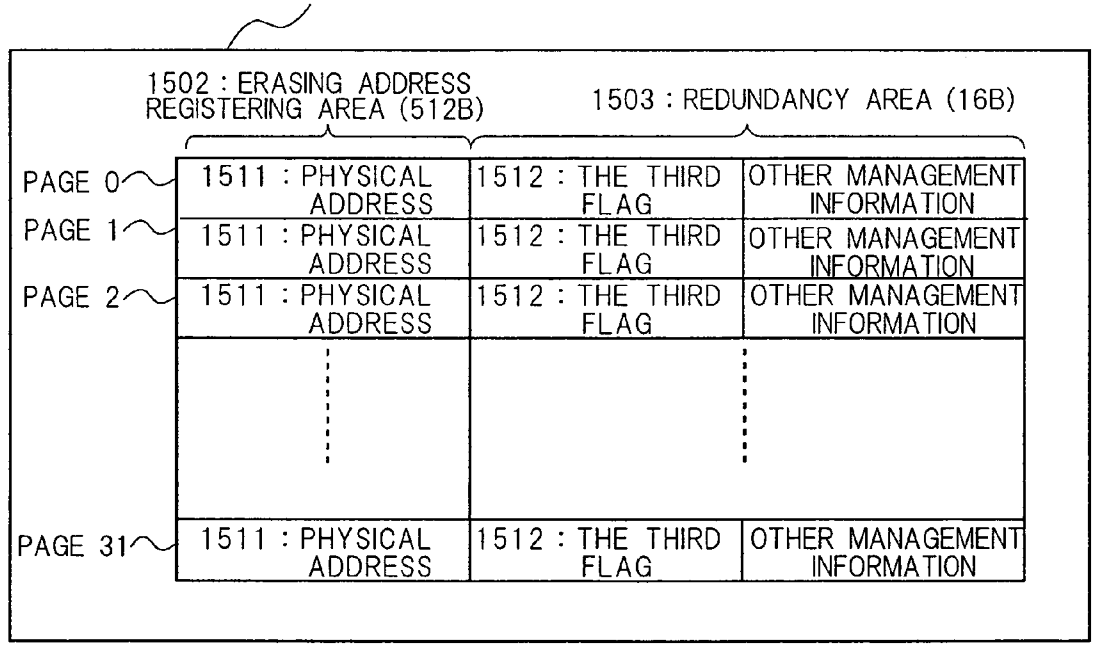
FIG. 15 shows the configuration of an erasing appointment table in accordance with the fifth embodiment of the present invention.

FIG. 15 shows the configuration of an erasing appointment table. An erasing appointment table 1501 consists of an erasing address registering area 1502 which registers the physical address 1511 of a physical block to be erased and a redundancy area 1503. The redundancy area 1503 has a third flag 1512. The third flag 1512 is represented in a plurality of bit data in order to enhance data reliability. In regard to the fifth embodiment, the third flag is comprised of two bits, and is represented with a logic value 11 or 00. The third flag 1512 represents whether the physical block which is indicated by the physical address 1511 written in the erasing address registering area 1502 of that page is erased or not. When the third flag is "11", the physical block is judged as not yet erased, and when the third flag is "00", the physical block is judged as erased. Since the erasing appointment table 1501 is comprised of physical block 1401, it has page 0 to page 31, and can register 32 physical addresses. In regard to the fifth embodiment, registration of a physical address will be executed from page 0 in an ascending order.

Figure 16:
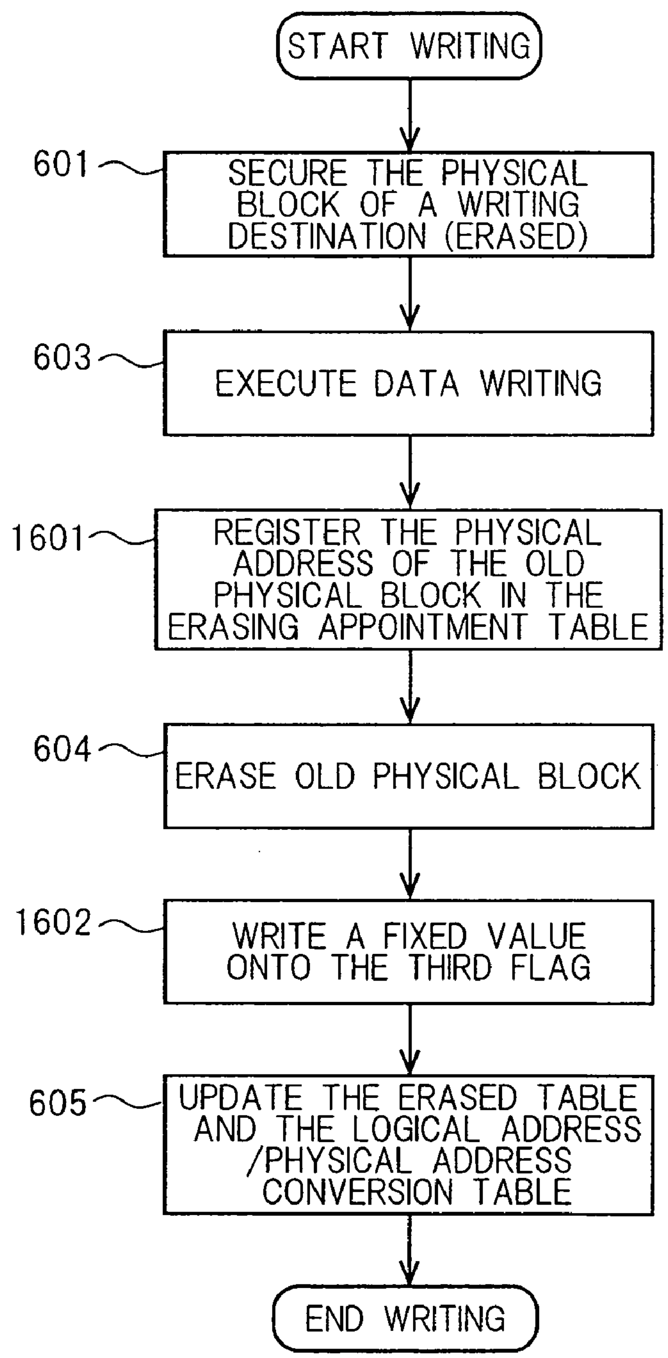
FIG. 16 is a flowchart of a data rewriting method of a non-volatile memory apparatus 101 in accordance with the fifth embodiment of the present invention.

The data rewriting method in accordance with the fifth embodiment will be described with reference to FIG. 16 and FIG. 17. FIG. 16 is a flowchart of a data rewriting method of a non-volatile memory apparatus 101 in accordance with the fifth embodiment. In regard to FIG. 16 (the fifth embodiment), an identical numeral is affixed to steps identical with FIG. 25 (the conventional art). FIG. 17 shows the status in which a physical address and a third flag is written onto the erasing appointment table in stages. In regard to FIG. 17, the physical block which is registered on page 0 and page 1 is erased, since a physical address is already written onto page 0 and page 1, and the third flag is "00". Page 2 is used on this occasion.

Difference of the data rewriting method in accordance with the fifth embodiment (FIG. 16) from that of the conventional art (FIG. 25) is that step 1601 and step 1602 are appended. Step 1601 and later will be described.

After the data writing of the physical block is completed, the physical address 1511 of the old physical block which includes invalid data (data which became unnecessary as a result from writing a new data) is registered in the erasing address registering area 1502 of the erasing appointment table 1501 (step 1601, part (b) of FIG. 17). By registering it in the erasing appointment table it indicates that it is a physical block to be erased. Subsequently, the old physical block is erased (step 604).

A fixed value (00 in the embodiment) is written onto the third flag 1512 of the redundancy area 1503 of page 2 of the erasing appointment table which registered the physical address 1511 of the old physical block (step 1602, part (c) of FIG. 17). By writing a fixed value to the third flag, it indicates that the erasing of an old physical block which is registered is completed.

The erased table 105 and the logical address/physical address conversion table 106 are updated (step 605). More specifically, 0 (written) is written onto a bit corresponding to the physical block which was secured in step 601, in the erased table 105. 1 (erased) is written onto the bit corresponding to the old physical block which was erased in step 604. The physical address corresponding to the logical address of the logical address/physical address conversion table 106 is updated so as to indicate the physical block in which the writing from the old physical block was executed.

Figure 18:
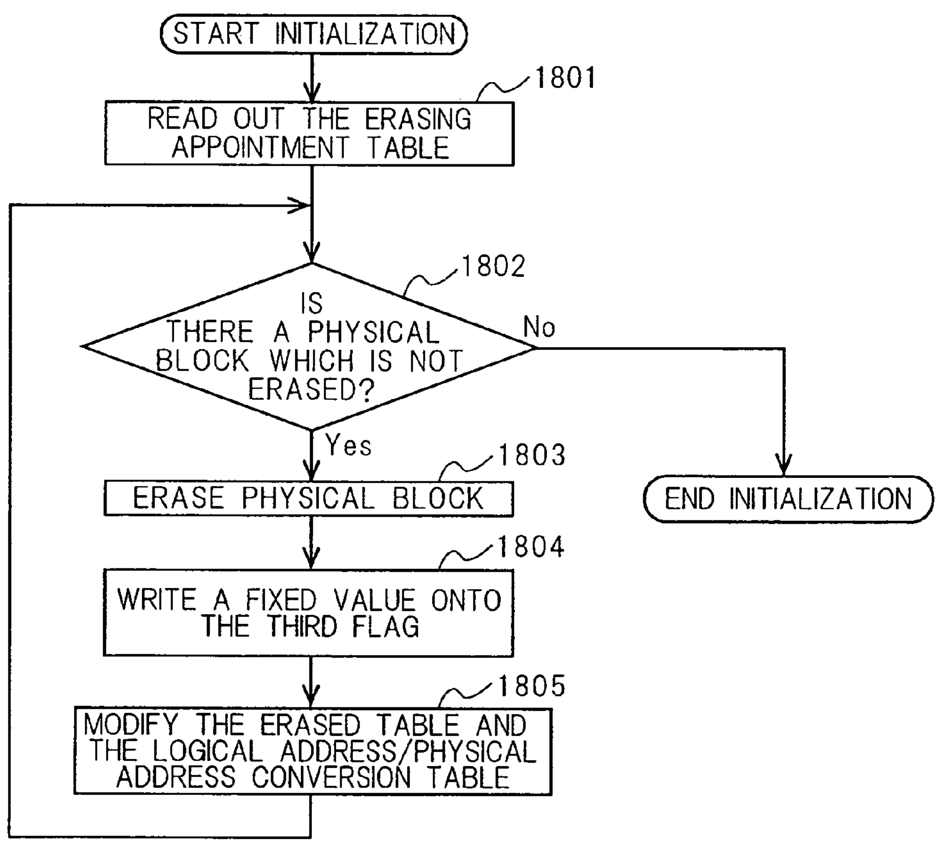
FIG. 18 is a flowchart of an initialization process of a non-volatile memory apparatus 101 in accordance with the fifth embodiment of the present invention.

The non-volatile memory apparatus 101 in accordance with the fifth embodiment executes an initialization process shown in FIG. 18 after executing an initialization process shown in FIG. 4. In regard to FIG. 4, since it is identical with the conventional art, its description will be omitted. FIG. 18 will be described.

The erasing appointment table 1501 which is disposed in the management area 1411 of the non-volatile memory 103 is read out (step 1801). Whether a physical block which is not erased exists or not is judged (step 1802). When the physical address 1511 is not registered in the erasing address registering area 1502 of the erasing appointment table 1501, or when a fixed data (00) is written onto the third flag 1512 corresponding to all the registered physical addresses 1511, it judges that there is no physical block which is not erased, and ends the initialization process.

When a physical address 1511 is registered in the erasing appointment table 1501, but the third flag 1512 is not written (11), it judges that erasing was ended in midpoint due to a power shut down and the like, and erases the physical block which is registered (step 1803). A fixed value is written onto the third flag 1512 corresponding to the physical block which was erased in the erasing appointment table 1501 (step 1804).

The erased table 105 and the logical address/physical address conversion table 106 is modified, since there is a possibility of an error in the generated table due to abnormal conditions such as a power shut down during erasing (step 1805). More specifically, the erased physical block is registered in the erased table 105. When there is an erased physical block in the logical address/physical address conversion table 106, its registration is deleted. It returns to step 1802, and repeats the process until the physical blocks which are registered in the erasing appointment table are all erased.

According to the control method of a non-volatile memory apparatus in accordance with the fifth embodiment of the present invention, it can detect for certain whether erasing of the physical block 501 is completed or not by writing the physical address 1511 and the third flag 1512 onto the erasing appointment table 1501. Even when erasing of the physical block was interrupted in midpoint due to a power shut down and the like, it can completely erase the physical block which is not erased at the next startup, based on the erasing appointment table 1501, and both the erased table 105 and the logical address/physical address conversion table 106 can be generated correctly. Thereby, wrongly writing data onto the physical block which is not erased can be prevented.

The control method of a non-volatile memory apparatus in accordance with the fifth embodiment which corresponds to a power shut down during data erasing can be combined with any one of the control method of a non-volatile memory apparatus of the first embodiment through the fourth embodiment which corresponds to a power shut down during data writing. Thereby, an erased table 105 and an logical address/physical address conversion table 106 having a still higher reliability can be generated.

The erasing appointment table 1501 in accordance with the fifth embodiment is not restricted to erasing the old physical block at the time of data rewriting, but can also be used in a case of erasing the physical block based on an erasing command from the host 102.

SIXTH EMBODIMENT

Figure 20:
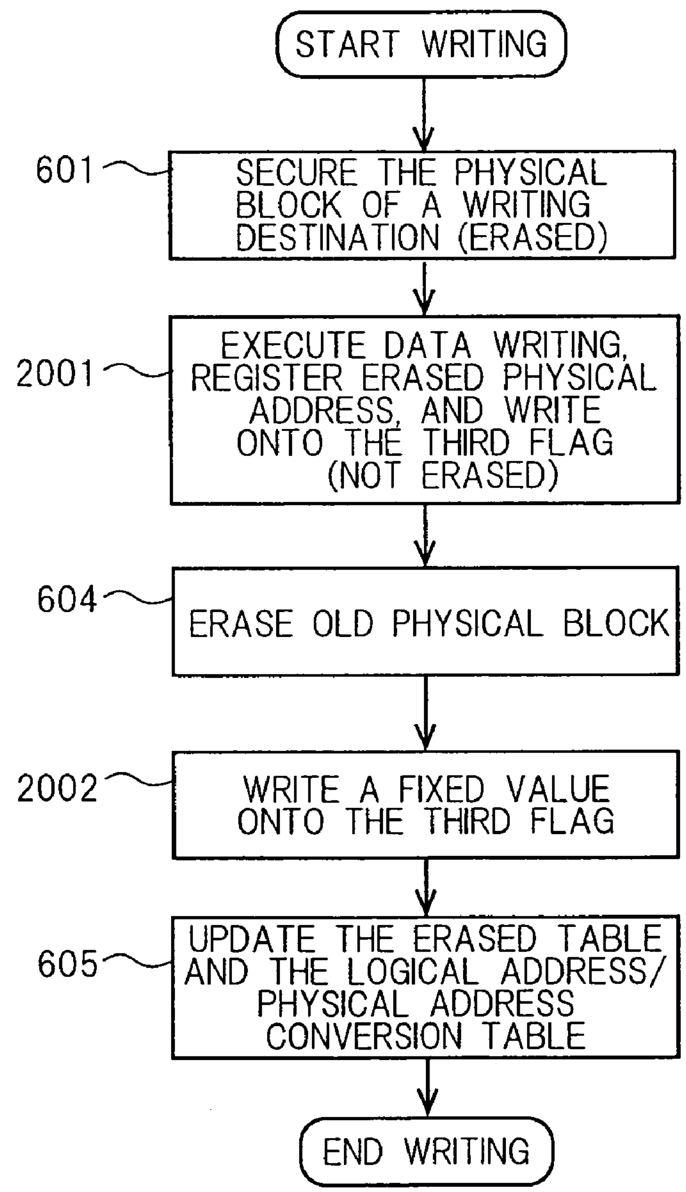
FIG. 20 is a flowchart of a data rewriting method of a non-volatile memory apparatus 101 in accordance with the sixth embodiment of the present invention.

The control method of a non-volatile memory apparatus in accordance with the sixth embodiment will be described with reference to FIG. 19 through FIG. 21. The control method of a non-volatile memory apparatus in accordance with the sixth embodiment is a method which can cope with a case in which a power shut down occurs during data erasing.

The point in which the control method of a non-volatile memory apparatus in accordance with the sixth embodiment differs from the fifth embodiment will be described. The control method in accordance with the fifth embodiment registers the physical address 1511 of the physical block to be erased and the third flag 1512 which indicates whether that physical block is erased or not, in the erasing appointment table 1501 disposed in the management area 1411 of the non-volatile memory 103. Since the control method in accordance with the fifth embodiment registers the physical address 1511 in the erasing appointment table 1501 in a different step from the data writing to the physical block 501 of the data recording area 1412, there was a drawback in which the time necessary for writing to the erasing appointment table 1501 is long.

In the sixth embodiment, a control method in which the processing time is short is realized. FIG. 19 shows the configuration of a physical block in accordance with the sixth embodiment. The physical block 501 in accordance with the sixth embodiment has a physical address 1911 of an old physical block (referred to as “old physical address”) and a third flag 1512 which indicates whether the old physical block is erased or not, in the redundancy area 503 of the pre-determined page (the first page in the embodiment). The registering area of the old physical address 1911 in accordance with the sixth embodiment is comprised of 2 bytes.

The third flag 1512 is represented in a plurality of bit data in order to enhance data reliability, as with the third flag in accordance with the fifth embodiment. In regard to the sixth embodiment, the third flag is comprised of two bits, and is represented with a logic value 11 or 00. The third flag 1512 represents whether the physical block which is indicated by the old physical address 1911 is erased or not. When the third flag is "11", the physical block which is indicated by the old physical address 1911 is judged as not yet erased, and when the third flag is "00", the physical block is judged as erased.

In regard to the sixth embodiment, a non-volatile memory 103 does not have an erasing appointment table 1501, and registers whether the old physical block is erased or not by using the redundancy area 503 of the physical block 501 of the writing destination.

The data rewriting method in accordance with the sixth embodiment will be described with reference to FIG. 20. FIG. 20 is a flowchart of a data rewriting method of a non-volatile memory apparatus 101 in accordance with the sixth embodiment. In FIG. 20, an identical numeral is affixed to steps identical with FIG. 25 of the conventional art.

When a data writing command is received from the host 102, the controller 104 of the non-volatile memory apparatus 101 detects an erased physical block from an erased table 105, and secures it as a physical block of a writing destination (referred to as "new physical block")(step 601).

The physical address 1911 of the old physical block which includes invalid data (data which became unnecessary as a result from writing a new data) and the third flag 1512 (value is 11 indicating that it is not yet erased) corresponding to the old physical block is written onto the redundancy area 503 of the first page of the new physical block (step 2001) simultaneously with the data writing onto the new physical block.

The old physical block is erased (step 604). A fixed value (00 in the embodiment indicating that it is erased) is written onto the third flag which is disposed in the redundancy area 503 of the first page of the new physical block (step 2002). By writing a fixed value to the third flag, it indicates that the old physical block is erased. The erased table 105 and the logical address/physical address conversion table 106 are updated (step 605).

The initialization process of a non-volatile memory apparatus in accordance with the sixth embodiment will be described with reference to FIG. 21. The non-volatile memory apparatus in accordance with the sixth embodiment generates an invalid table on a RAM at the time of the initialization process based on the third flag 1512. An invalid table is a table for registering a physical address of the incorrect old physical block in which the data erasing was interrupted due to a power shut down and the like, and a physical address of the new physical block in which whether the old physical block is erased or not is registered. FIG. 21 is a flowchart of an initialization process of a non-volatile memory apparatus 101 in accordance with the sixth embodiment. In FIG. 21, an identical numeral is affixed to steps identical with FIG. 4 of the conventional art, and its description will be omitted. Step 2101 through step 2107 will be described.

In regard to the physical block 501 which is judged as written in step 401 through step 406, whether an old physical block in which the third flag 1512 is unwritten (=11) exists or not is judged, based on the redundancy area 503 of the first page which is read out in step 402 (step 2101). When the old physical address 1911 is not registered, or when the third flag 1512 is written (=00), it proceeds to step 407.

When the old physical address is registered, but the third flag 1512 is unwritten, it judges that an abnormal condition such as a power shut down has occurred during erasing, and that erasing of the old physical block has not completed. The physical address of the new physical block (the physical block in which the physical address of the old physical block 1911 is written onto the redundancy area 503) and the physical address of the old physical block is registered in the invalid table generated on a RAM (step 2102), and proceeds to step 407.

Whether the present physical block is a final physical block or not is judged (step 407). When it is not a final physical block, 1 is added to the block counter (step 408), and returns to step 402. When it is a final physical block, it judges whether the address of the new physical block and the address of the old physical block is written or not onto the invalid table which is generated on a RAM (step 2103). When the invalid table is void, the initialization is ended. When an address is registered as the invalid data, its old physical block is erased (step 2104). A fixed value is written onto the third flag of the new physical block in which the physical address of the erased old physical block is written (step 2105). By writing a fixed value onto the third flag, it indicates that the old physical block is erased completely. The invalid table on a RAM is updated (step 2106). More specifically, the address of the new physical block and the address of the old physical block is deleted from the invalid table, and indicate that there is no old physical block which is not yet erased.

The erased table 105 and a logical address/physical address conversion table 106 is updated since there is a possibility of an error in the generated table due to abnormal conditions such as a power shut down during erasing (step 2107). More specifically, the erased old physical block is registered in the erased table 105. When there is an erased old physical block in the logical address/physical address conversion table 106, its registration is deleted.

The control method of a non-volatile memory apparatus in accordance with the sixth embodiment does not need to secure an exclusive area for providing an erasing appointment table 1501 in the management area 1411 of the non-volatile memory 103. Since the physical address 1911 of the old physical block is registered in its first page simultaneously with the data writing onto the physical block 501 of the data recording area 1412, the processing time would be short compared with that of the fifth embodiment. However, the control method in accordance with the sixth embodiment can only be used at a time of data rewriting since the physical address 1911 of the old physical block to be erased is registered in the redundancy area 503 of the new physical block 501, and can not be used in a case of erasing the physical block based on the erasing command from the host 102.

The non-volatile memory apparatus 101 in accordance with the sixth embodiment can shorten the time necessary for data rewriting by transmitting the writing data which is to be executed subsequently to the non-volatile memory 103, in parallel with the erasing of the old physical block.

The registration of the physical address 1911 of the old physical block and the registration of the third flag 1512 is not restricted to the first page of the new physical block 501. It may be registered in the redundancy area 503 of a page other than the first page of the new physical block. In this case, it just needs to add a step in the initialization process, in between step 406 and step 2101 in FIG. 21, which reads out the redundancy area of the page which has the old physical address 1911 and the third flag 1512.

The control method of a non-volatile memory apparatus in accordance with the sixth embodiment which corresponds to a power shut down during data erasing can be combined with any one of the control method of a non-volatile memory apparatus of the first embodiment through the fourth embodiment which corresponds to a power shut down during data writing. Thereby, an erased table 105 and the logical address/physical address conversion table 106 having a still higher reliability can be generated.

SEVENTH EMBODIMENT

The control method of a non-volatile memory apparatus in accordance with the seventh embodiment will be described with reference to FIG. 22. In the first embodiment through the sixth embodiment, the control method of a non-volatile memory apparatus which can detect interruption of process during data writing or data erasing at the next startup even when the process was interrupted due to occurrences of a power shut down and the like during data writing or data erasing, and can correctly generate an erased table 105 and a logical address/physical address conversion table 106, using the first flag, the second flag, the third flag or the complementary data, was described.

In regard to the control method of a non-volatile memory apparatus in accordance with the seventh embodiment, a method that can correctly write data even when it is the same configuration as the conventional physical block which does not have the above-mentioned first flag through third flag and the complementary data, is realized. In regard to the seventh embodiment, it can not detect that the process was interrupted due to a power shut down and the like, since the physical block does not have the first flag through the third flag and the complementary data, and executes the initialization process which is identical with the conventional art. For example, there is a case in which an incorrect physical block in which erasing is not completed due to a power shut down and the like is wrongly judged as erased, and registers it in the erased table 105 (FIG. 4, step 404).

Figure 22:
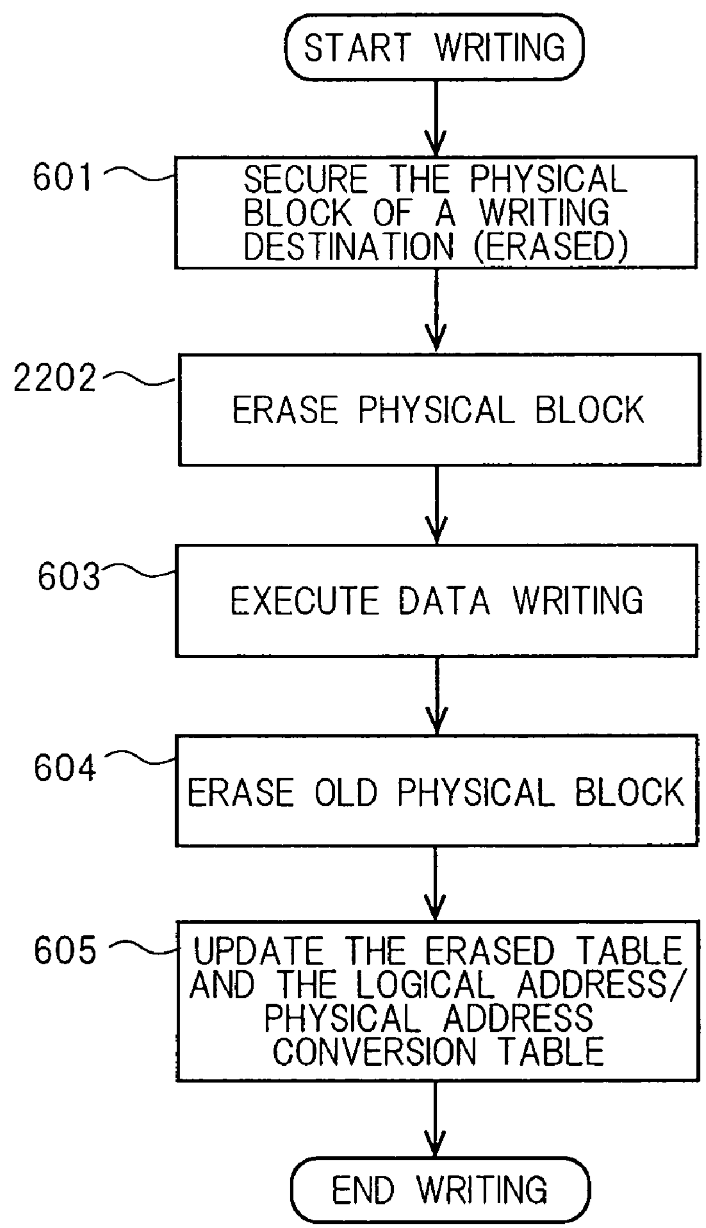
FIG. 22 is a flowchart of a data rewriting method of a non-volatile memory apparatus 101 in accordance with the seventh embodiment of the present invention.

Consequently, in regard to the seventh embodiment, data rewriting is executed using the method in FIG. 22. FIG. 22 is a flowchart of a data rewriting method of a non-volatile memory apparatus 101 in accordance with the seventh embodiment. In FIG. 22, an identical numeral is affixed to steps identical with FIG. 25, and its description will be omitted. Difference of the data rewriting method in accordance with the seventh embodiment (FIG. 22) from that of the conventional art (FIG. 25) is that step 2202 is appended.

When a data writing command is received from the host 102, the controller 104 of the non-volatile memory apparatus 101 detects an erased physical block from an erased table 105, and secures it as a physical block of a writing destination (step 601). However, there is a possibility that the physical block of the writing destination is wrongly registered in the erased table in the initialization process even though it is not actually erased due to the abnormal condition such as a power shut down during writing or during erasing. Therefore, the secured physical block of a writing destination is once erased, and is put in an erased status for certain (step 2202). Subsequently, data is written onto the physical block (step 603).

The control method in accordance with the seventh embodiment can correctly process the writing command from the host 102 by once erasing the physical block, even in a case where the physical block which is not erased in the initialization process is wrongly judged as erased, and registered in the erased table 105.

The control method of a non-volatile memory apparatus in accordance with the seventh embodiment can be combined with the first embodiment through the sixth embodiment. Thereby, an erased table 105 and the logical address/physical address conversion table 106 can be generated correctly, and can write data onto the physical block which is erased for certain although the processing time such as the writing time and the readout time increases.

EIGHTH EMBODIMENT

The control method of a non-volatile memory apparatus in accordance with the eighth embodiment will be described with reference to FIG. 23. The eighth embodiment is a method that can rewrite data correctly even when it is the same configuration as the conventional physical block in which the physical block does not have the first flag through the third flag and the complementary data, as with the seventh embodiment.

Figure 23:
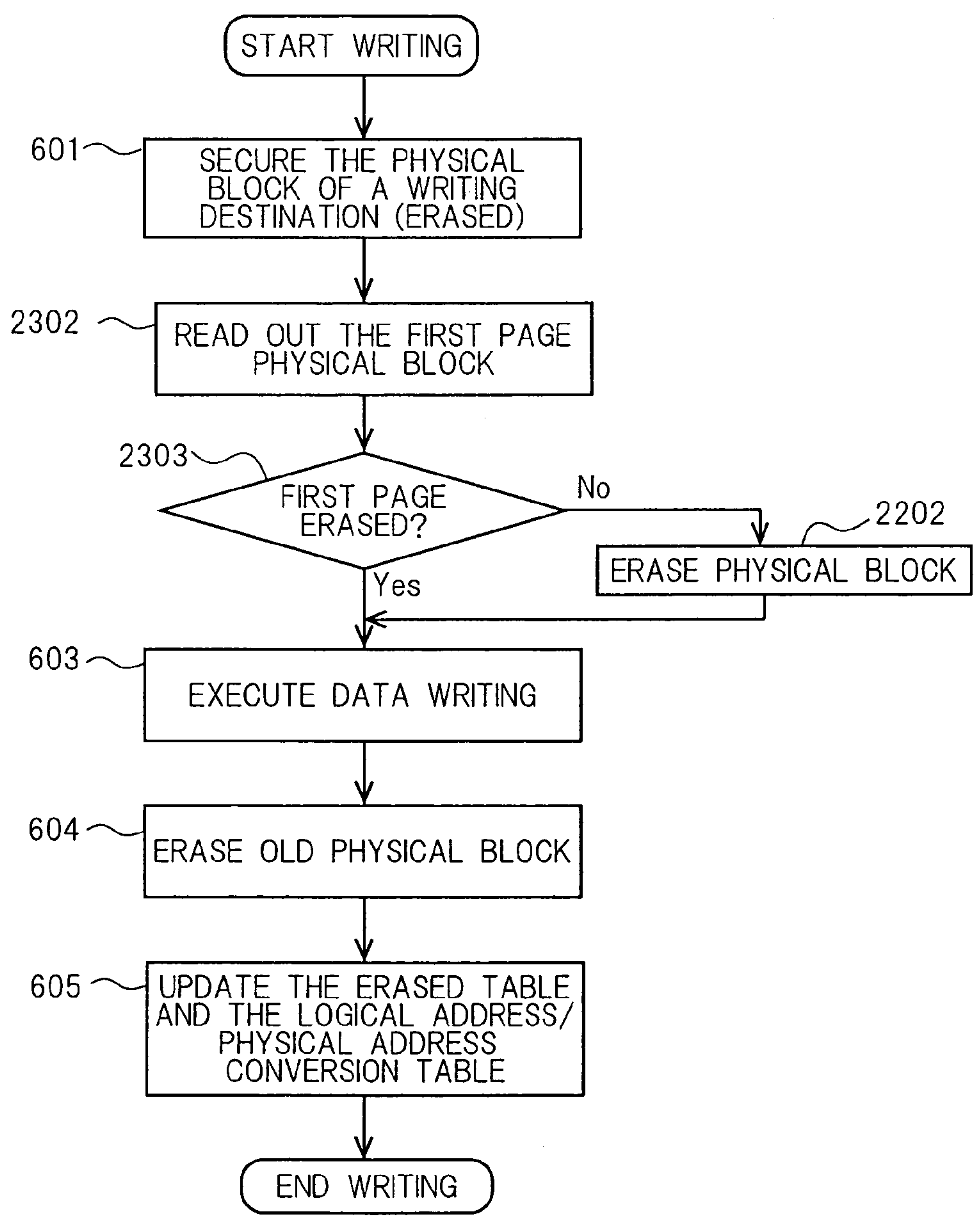
FIG. 23 is a flowchart of a data rewriting method of a non-volatile memory apparatus 101 in accordance with the eighth embodiment of the present invention.

FIG. 23 is a flowchart of a data rewriting method of a non-volatile memory apparatus 101 in accordance with the eighth embodiment. In FIG. 23, an identical numeral is affixed to steps identical with FIG. 22, and its description will be omitted. Difference of the data rewriting method in accordance with the eighth embodiment (FIG. 23) from that of the seventh embodiment (FIG. 22) is that step 2302 and step 2303 are appended. In other aspects, it is identical with the seventh embodiment.

In the seventh embodiment, all the physical blocks are once erased before data writing. However, the time necessary for erasing the physical block of the non-volatile memory 103 is by far longer than the time necessary for reading out a single page of the physical block. Consequently, the data of the first page which has the management information of the physical block of a writing destination is read out in the eighth embodiment (step 2302). When the physical block is not erased, the management information (for example an information such as the complementary data, the ECC code and/or CRC code of data written onto the data area, and the logical address corresponding to its physical block) of that physical block is written onto the redundancy area of the first page. Whether the physical block is erased or not can be judged, when the first page is read out, and whether the management information are all 1, or includes a 0 is detected.

Whether the first page is erased or not is judged (step 2303), and in a case where the first page is not erased, it judges that the erasing of the physical block is not completed due to a power shut down and the like, and erases the physical block (step 2202). When the first page is erased, it proceeds to step 603 without executing step 2202.

The control method in accordance with the eighth embodiment can correctly process the writing command from the host 102, even in a case where the physical block which is not erased in the initialization process is wrongly judged as erased, and registered in the erased table 105.

In the eighth embodiment, it can shorten the time necessary for data rewriting than the seventh embodiment by reading out the first page of the physical block and judging whether it is erased or not, and erasing only the physical block which is not yet erased.

The control method of a non-volatile memory apparatus in accordance with the eighth embodiment can be combined with the first embodiment through the sixth embodiment. When a physical block of an incorrect status exists in the non-volatile memory 103, the correctness of the data writing improves by using the embodiments in combinations. An erased table 105 and the logical address/physical address conversion table 106 can be correctly generated, and can write data onto a physical block which is erased for certain.

The present invention can achieve an advantageous effect in which a control method of a non-volatile memory apparatus which can operate data writing normally after the next startup even when a process is interrupted due to the occurrences of abnormal conditions such as a power shut down during data writing or data erasing can be realized. Thereby, a control method of a non-volatile memory apparatus which can access correctly to a non-volatile memory, and having a high data reliability can be realized.

Although the invention has been described in its preferred form with a certain degree of particularity, it is understood that the present disclosure of the preferred form has been changed in the details of construction and the combination and arrangement of parts can be resorted to without departing from the spirit and the scope of the invention as hereinafter claimed.

INDUSTRIAL APPLICABILITY

The present invention is useful as a control method of a non-volatile memory apparatus (a memory card for example) which is used by connecting to a portable device for example.

The invention claimed is:

1. A control method of a non-volatile memory apparatus comprising:

a controlling step of controlling data writing and data readout of a non-volatile memory, by using an erased table and a logical address/physical address conversion table, the non-volatile memory having a plurality of physical blocks, each physical block being an erasing unit of data, the erased table indicating whether the physical blocks are erased or not, the logical address/physical address conversion table converting a logical address to a physical address;

a writing step; the writing step of including:

a first flag writing step of writing a fixed value on a first flag existing in a redundancy area on a first page of a physical block onto which data is to be written, a value of said first flag indicating whether data is to be written onto the first page of the physical block or not, the first page being within a plurality of pages which are included in said physical block, each page having a data area and the redundancy area, and each page being a minimum data writing unit, the first flag being included in each physical block; and a data writing step of writing data onto the first page after the first flag writing step; and an initialization step of reading out said first flag of all said physical blocks of said non-volatile memory at the startup of the non-volatile memory apparatus, and generating the logical address/physical address conversion table and the erased table based on whether said first flag is written or not.

2. A control method of a non-volatile memory apparatus comprising:

a controlling step of controlling data writing and data readout of a non-volatile memory, by using an erased table and a logical address/physical address conversion table, the non-volatile memory having a plurality of physical blocks, each physical block being an erasing unit of data, the erased table indicating whether the physical blocks are erased or not, a the logical address/physical address conversion table converting a logical address to a physical address;

a writing step; the writing step of including:

a first flag writing step of writing a fixed value on a first flag existing in a redundancy area on a first page of a physical block onto which data is to be written, a value of the first flag indicating whether data is written onto the first page of the physical block or not, the first page being within a plurality of pages which are included in said physical block, each page having a data area and the redundancy area, and each page being a minimum data writing unit, the first flag being included in each physical block;

a data writing step of writing data from the first page to the last page included in the physical block after the first flag writing step; and a second flag writing step of writing a fixed value on a second flag existing in the redundancy area on a pre-determined page of said physical block and indicating whether writing data onto the physical block is completed or not after the data writing step; and an initialization step of reading out said first flags and said second flags of all said physical blocks of the non-volatile memory at the startup of said non-volatile memory apparatus, and generating the logical address/physical address conversion table and the erased table based on whether said first flag and said second flag is written or not.

3. The control method of a non-volatile memory apparatus in accordance with claim 1, further comprising:

a writing step of writing an ECC code and/or a CRC code of data of a last page, or these codes as well as complementary data of the ECC code and/or the CRC code onto the redundancy area of the last page when writing data on the physical block; and an initialization step of reading out data and the ECC codes and/or the CRC codes of the data, or these data and codes as well as complementary data of the ECC code and/or the CRC code, from the last pages of all of said physical blocks of said non-volatile memory, executing an error detection, and generating the logical address/physical address conversion table based on presence or absence of an error at the startup of said non-volatile memory apparatus.

4. The control method of a non-volatile memory apparatus in accordance with claim 1, further comprising a last page writing step of writing data onto all addresses of an area of a last page of said physical block, excluding an area for writing data which can be written singularly and separately, and filling the area with data and an ECC code and/or a CRC code of said data, or filling it with these data and codes as well as complementary data of the ECC code and/or the CRC code.

5. The control method of a non-volatile memory apparatus in accordance with claim 4, further comprising an initialization step of reading out said data and said ECC codes and/or the CRC codes of said data, or these data and codes as well as complementary data of the ECC code and/or the CRC code, of the last pages of all said physical blocks of said non-volatile memory, executing an error detection, and generating the logical address/physical address conversion table based on presence or absence of an error at the startup of said non-volatile memory apparatus.

* * * * *

UNITED STATES PATENT AND TRADEMARK OFFICE

CERTIFICATE OF CORRECTION

PATENT NO. : 7,321,959 B2
APPLICATION NO. : 10/496622
DATED : January 22, 2008
INVENTOR(S) : Toshiyuki Honda et al.

It is certified that error appears in the above-identified patent and that said Letters Patent is hereby corrected as shown below:

Column 29, Line 61: "a" should be deleted.

Signed and Sealed this

Nineteenth Day of August, 2008

JON W. DUDAS
*Director of the United States Patent and Trademark Office*